(12) United States Patent
Nakagawa

(10) Patent No.: US 6,531,402 B2
(45) Date of Patent: Mar. 11, 2003

(54) METHOD FOR ETCHING ORGANIC FILM, METHOD FOR FABRICATING SEMICONDUCTOR DEVICE AND PATTERN FORMATION METHOD

(75) Inventor: Hideo Nakagawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/798,912

(22) Filed: Mar. 6, 2001

(65) Prior Publication Data

US 2001/0046781 A1 Nov. 29, 2001

(30) Foreign Application Priority Data

May 26, 2000 (JP) ........................................ 2000-155820

(51) Int. Cl.[7] ...................... H01L 21/302; H01L 21/461
(52) U.S. Cl. ...................... 438/710; 438/706; 438/707; 438/725
(58) Field of Search ................................ 438/706, 707, 438/710, 725

(56) References Cited

U.S. PATENT DOCUMENTS 6,265,320 B1 * 7/2001 Shi et al. .................... 438/725

FOREIGN PATENT DOCUMENTS

| JP | 64-25419 | 1/1989 |
| WO | WO 00/67308 | 11/2000 |

OTHER PUBLICATIONS

M. Fukasawa et al., "Etching Characteristics of Organic Low–k Film", Proceedings of Symposium on Dry Process, VII–3, pp. 175–182, Nov. 1998.
M. Fukasawa et al., "Organic Low–k Film Etching Using N–H Plasma", Proceedings of Symposium on Dry Process, IV–2, pp. 221–226, Nov. 1999.
W. Chen et al., "$SiO_2$ etching in magnetic neutral loop discharge plasma", J. Vac. Sci. Technol. A, vol. 16, No. 3, May/Jun. 1998.
G. Rajagopalan et al., "Development of Damascene Etch Process for Organic Dielectric Materials", Abstract of the 1999 Joint International Meeting of ECS, vol. 99–2, No. 702, Oct. 1999.
Partial English Translation of Laid Open Unexamined Japanese Patent Application Publication No. 64–25419.

* cited by examiner

*Primary Examiner*—Alexander Ghyka
(74) *Attorney, Agent, or Firm*—Nixon Peabody LLP; Donald R. Studebaker

(57) ABSTRACT

An organic film is etched by using plasma generated from an etching gas containing a first gas including a straight chain saturated hydrocarbon and a second gas including a nitrogen component.

17 Claims, 16 Drawing Sheets

FIG. 2A 0.16 μm 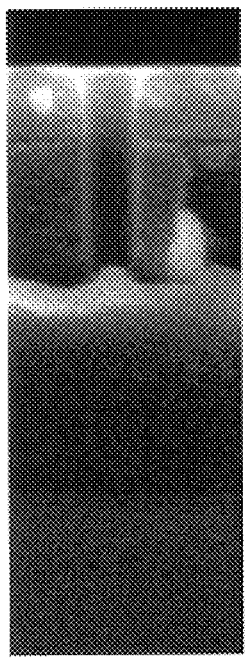
FIG. 2B 0.18 μm 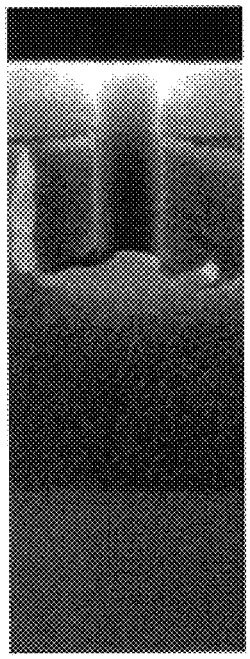
FIG. 2C 0.24 μm 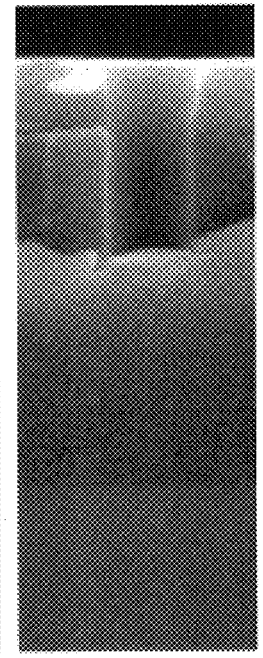
FIG. 2D 0.40 μm 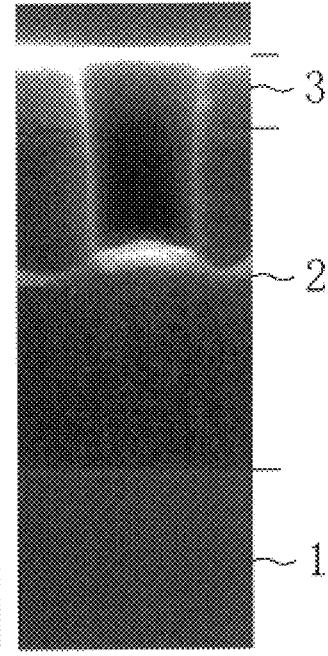

CH4=0ml, N2=100ml

CH4=30ml, N2=70ml

CH4=50ml, N2=50ml

CH4=70ml, N2=30ml

CH4=100ml, N2=0ml 0.16 μm     0.18 μm     0.24 μm     0.40 μm

METHOD FOR ETCHING ORGANIC FILM, METHOD FOR FABRICATING SEMICONDUCTOR DEVICE AND PATTERN FORMATION METHOD

BACKGROUND OF THE INVENTION

The present invention relates to a method for etching an organic film, a method for fabricating a semiconductor device and a pattern formation method.

For the purpose of increasing the operation speed and lowering the consumption power of semiconductor devices, decrease of the dielectric constant of an interlayer insulating film included in a multi-level interconnect structure is recently regarded as significant. In particular, an organic film with a small dielectric constant can be easily formed by spin coating and curing, and hence is regarded as a very promising interlayer insulating film of the next generation. A well known example of the organic film with a small dielectric constant is an organic film including an aromatic polymer as a base.

In order to fabricate a device with a refined design rule of a gate length of 0.18 µm or less, a fine line processing technique of approximately 0.25 µm or less is necessary, and the design rule is considered to be more and more refined in the future. An organic film is generally patterned by plasma etching, but a fine pattern of 0.25 µm or less is very difficult to form from an organic film.

Known examples of the plasma etching employed for an organic film are a process using an etching gas including a $N_2$ gas and a $H_2$ gas as principal constituents (reported by M. Fukusawa, T. Hasegawa, S. Hirano and S. Kadomura in "Proc. Symp. Dry Process", p. 175 (1998)) and a process using an etching gas including a $NH_3$ gas as a principal constituent (reported by M. Fukusawa, T. Tatsumi, T. Hasegawa, S. Hirano, K. Miyata and S. Kadomura in "Proc. Symp. Dry Process", p. 221 (1999)).

CONVENTIONAL EXAMPLE 1

One of conventional etching methods will now be described as Conventional Example 1 referring to the result obtained by etching an organic film with a magnetic neutral loop discharge (NLD) plasma etching system manufactured by Ulvac Corporation ("SiO$_2$ Etching in magnetic neutral loop discharge plasma", W. Chen, M. Itoh, T. Hayashi and T. Uchida, J. Vac. Sci. Technol., A16 (1998) 1594).

In Conventional Example 1, an organic film is etched by using an etching gas including a $N_2$ gas and a $H_2$ gas as principal constituents. The present inventors have carried out the etching process of Conventional Example 1 under the following conditions:

Plasma etching system: NLD plasma etching system
Volume flow ratio per minute in standard condition of etching gas:

$N_2:H_2$=50 ml:50 ml

Antenna power: 1000 W (13.56 MHz)
Bias power: 200 W (2 MHz)
Pressure: 0.4 Pa
Substrate cooling temperature: 0° C.
Etching time: 180 seconds FIGS. 13A through 13D are cross-sectional SEM photographs of holes formed under the aforementioned etching conditions in organic films, and the holes of FIGS. 13A through 13D have diameters of 0.16 µm, 0.18 µm, 0.24 µm and 0.40 µm, respectively. In FIGS. 13A through 13D, a reference numeral 101 denotes a silicon substrate, a reference numeral 102 denotes an organic film to be etched, and a reference numeral 103 denotes a mask pattern of a silicon oxide film used as a mask in etching the organic film 102. The organic film 102 has a thickness of approximately 1.02 µm, and the mask pattern 103 has a thickness of approximately 240 nm.

Conventional Example 1 is described as a process using the etching gas including, as principal constituents, a $N_2$ gas and a $H_2$ gas, and another method for etching an organic film is proposed as a process using an etching gas including, as principal constituents, an $O_2$ gas, a $N_2$ gas and a $C_2H_4$ gas (Genexh Rajagopalan, et al.; Abstra. The 1999 Joint International Meeting of ECS, Hawaii, October, 702 (1999)).

CONVENTIONAL EXAMPLE 2

Now, a method for fabricating a semiconductor device according to Conventional Example 2 will be described with reference to FIGS. 14A and 14B.

FIGS. 14A and 14B show states where an organic film 105 formed on a semiconductor substrate 104 is subjected to plasma etching by using a mask pattern 106 of, for example, a silicon oxide film formed on the organic film 105. FIG. 14A shows a state in the middle of the plasma etching and FIG. 14B shows a state after completing the plasma etching. In FIGS. 14A and 14B, a reference numeral 107 denotes a first recess having a small diameter and a reference numeral 108 denotes a second recess having a comparatively large diameter. Although not shown in the drawings, a metal material film is formed over the mask pattern 106 so as to fill the first recess 107 and the second recess 108, and a portion of the metal material film formed on the mask pattern 106 is removed by, for example, chemical mechanical polishing (CMP), so as to form a connection plug or a metal interconnect from the metal material film.

As is shown in FIG. 14A, the etching rate of the first recess 107 having a small diameter is lower than the etching rate of the second recess 108 having a comparatively large diameter.

Also, as is shown in FIG. 14B, the etching time required for completing etching the first recess 107 is generally calculated on the basis of the etching rate of the first recess 107, and over-etching of several tens % is generally conducted in addition to the calculated etching time so as to completely remove the organic film 105 remaining on the semiconductor substrate 104 within the recess.

CONVENTIONAL EXAMPLE 3

As methods of forming a mask pattern through dry development, a top surface imaging (TSI) process, a three-layer resist process and the like are known.

In the top surface imaging process, a surface of an organic film resulting from pattern exposure is subjected to silylation, so as to selectively form a silylated layer on an exposed or unexposed portion of the organic film. Then, the organic film is subjected to dry development using the silylated layer as a mask, so as to form a mask pattern.

In the three-layer resist process, after an organic film and a silicon oxide film are successively formed on a semiconductor substrate, a thin resist pattern is formed on the silicon oxide film. Then, the silicon oxide film is subjected to plasma etching by using the resist pattern as a mask, so as to form an oxide film pattern by transferring the resist pattern onto the silicon oxide film. Next, the organic film is subjected to dry development (plasma etching) by using the oxide film pattern. Thus, a fine organic film pattern having a high aspect ratio is formed from the organic film.

Furthermore, an etch target film formed on the semiconductor substrate is etched by using a two-layer mask pattern consisting of the oxide film pattern and the organic film pattern. In this manner, a fine pattern that cannot be resolved by a single layer resist can be formed in the etch target film.

The present inventors have carried out the three-layer resist process, as a mask pattern formation method for Conventional Example 3, by using an etching gas including an $O_2$ gas under the following etching conditions:

Plasma etching system: NLD plasma etching system

Flow rate per minute in standard condition of etching gas: $O_2$=90 ml

Antenna power: 1000 W (13.56 MHz)

Bias power: 400 W (2 MHz)

Pressure: 0.133 Pa

Substrate cooling temperature: 0° C.

Etching time: 4 minutes

FIGS. 16A and 16B are cross-sectional SEM photographs of holes formed in an organic film pattern by the pattern formation method for Conventional Example 3, and the holes of FIGS. 16A and 16B have diameters of 0.18 μm and 0.4 μm, respectively. In FIGS. 16A and 16B, a reference numeral 111 denotes a silicon substrate, a reference numeral 110 denotes an organic film pattern formed from an organic film, and a reference numeral 109 denotes an oxide film pattern formed from a silicon oxide film. A resist pattern present on the oxide film pattern 109 is eliminated during the formation of the organic film pattern 110 through the dry development, and hence, an etch target film deposited on the silicon substrate 111 is etched by using the two-layer mask pattern consisting of the oxide film pattern 109 and the organic film pattern 110.

Problem of Conventional Example 1

FIG. 15 is a diagram of the RIE lag characteristic of the method for etching an organic film of Conventional Example 1. The RIE lag is a phenomenon that the etching rate is lowered when the aspect ratio of a recess to be etched is increased, which means that the etching rate is lowered as the processing dimension (the dimension of an opening to be formed) is smaller in etch target films having the same thickness.

FIG. 15 shows the relationship between the diameter of a hole and the etching depth obtained when holes having a diameter of 0.18 μm through 0.4 μm are formed in an organic film by conducting etching for 180 seconds by using an etching gas of a mixed gas including a $N_2$ gas and a $H_2$ gas in a ratio in the flow rate (ml) per minute in the standard condition, namely, $N_2$:$H_2$, of 0:100, 30:70, 50:50, 70:30 or 100:0. As is understood from FIG. 15, the typical RIE lag characteristic is observed in any of the ratios.

When the RIE lag characteristic is increased, a process margin such as allowance in etching amount is reduced in forming a fine pattern. Therefore, when holes with different diameters or interconnect grooves with different widths are formed together, excessive or insufficient etching is caused in the respective holes or interconnect grooves, which causes variation in the etching amount in underlying films. As a result, the reliability of the semiconductor device is lowered.

Moreover, since large over-etching is required for compensating the insufficient etching, variation in the dimension caused in transferring a pattern is increased. As a result, it is very difficult to highly precisely form a fine pattern.

Problem of Conventional Example 2

As described above, in the conventional method for fabricating a semiconductor device, the over-etching of several tens % is generally conducted in addition to the calculated etching time. Therefore, when the etch point reaches the semiconductor substrate 104 in the second recess 108 (having a comparatively large diameter) with the high etching rate, the etch point has not reached the semiconductor substrate 104 in the first recess 107 (having a small diameter) with the low etching rate.

Furthermore, as described above, the etching time is determined on the basis of the time required for completing etching the first recess 107.

Accordingly, excessive over-etching disadvantageously occurs in the bottom of the second recess 108.

Moreover, in the case where the etching time is insufficient, although the second recess 108 is sufficiently etched, the first recess 107 is disadvantageously insufficiently etched.

Accordingly, in the case where holes having different diameters or interconnect grooves having different widths are formed together, the excessive or insufficient etching is caused, which causes variation in the etching amount in underlying films. As a result, the reliability of the semiconductor device is lowered.

Problem of Conventional Example 3

In Conventional Example 3, the dry development is carried out on the organic film through the plasma etching using the etching gas including an $O_2$ gas as a principal constituent. Therefore, as is shown in FIGS. 16A and 16B, the hole formed in the organic film pattern 110 has a diameter larger than the diameter of an opening of the oxide film pattern 109, and the hole formed in the organic film pattern 110 has a bowing cross-section. When the etch target film is etched by using the organic film pattern 110 with the hole having such a bowing cross-section, it is difficult to highly precisely conduct the etching.

Therefore, in a method proposed for suppressing the hole of the organic film pattern 110 from having a bowing cross-section, the dry development is carried out on the organic film with the actual substrate temperature kept at a temperature below the freezing point by setting the substrate cooling temperature (refrigerant temperature) to 20° C. through 50° C. below zero.

In order to attain such a low temperature, however, excessive cost and a large-scaled system are required, and hence, there arise problems of increase of the system cost and decrease of the system stability. Therefore, it is not preferable that the substrate cooling temperature is set to 20° C. through 50° C. below zero.

As described so far, the problem that the hole formed in the organic film pattern 110 has a diameter larger than the diameter of the opening of the oxide film pattern 109 and the problem that the hole formed in the organic film pattern 110 has a bowing cross-section have not been solved yet.

Needless to say, the problems occurring in the three-layer resist process occur in the top surface imaging process.

SUMMARY OF THE INVENTION

In consideration of the aforementioned conventional problems, a first object of the invention is stably and uniformly etching an organic film by minimizing a RIE lag characteristic so as to avoid excessive or insufficient etching even when holes with different diameters or interconnect grooves with different widths are formed together.

A second object of the invention is, in fabricating a semiconductor device including holes with different diameters or interconnect grooves with different widths, improving the reliability of the semiconductor device by avoiding excessive or insufficient etching so as to suppress variation in the etching amount in underlying films.

A third object of the invention is, in forming an organic film pattern through dry development, highly precisely forming a mask pattern with a large process margin by preventing an opening of the organic film pattern from having a dimension larger than the dimension of an opening of a mask used for forming the organic film pattern and by forming an opening with a vertical cross-section or a cross-section tapered toward the bottom (hereinafter referred to as a forward taper cross-section) in the organic film pattern.

In order to achieve the first object, the method for etching an organic film of this invention comprises a step of etching an organic film by using plasma generated from an etching gas containing a first gas including a straight chain saturated hydrocarbon and a second gas including a nitrogen component.

In the present method for etching an organic film, an organic film is etched by using plasma generated from the mixed gas containing the gas including a hydrocarbon and the gas including a nitrogen component. Therefore, a deposition film is formed on an etch target surface, and owing to the deposition film, an ion assisted reaction is caused on the bottom of a recess substantially without depending upon the aspect ratio. Accordingly, a constant etching rate can be obtained without depending upon the aspect ratio, namely, the diameter of the recess.

In particular, since a straight chain saturated hydrocarbon is used as the hydrocarbon in the method for etching an organic film, a recess with a vertical or forward taper cross-section can be formed in the organic film with a very small RIE lag characteristic.

Accordingly, even when a fine pattern is to be formed, a process margin such as allowance in etching amount can be large, and even when holes with different diameters or interconnect grooves with different widths are to be formed together, excessive or insufficient etching can be avoided, so that underlying films can be substantially uniformly etched.

In the method for etching an organic film, the etching gas preferably further contains a gas including a compound including carbon, nitrogen and hydrogen.

When the gas including a compound including carbon, nitrogen and hydrogen is thus mixed with the mixed gas containing the gas including the straight chain saturated hydrocarbon and the gas including the nitrogen component, a recess to be formed can attain a forward taper cross-section with keeping the very small RIE lag characteristic. Furthermore, by adjusting the mixing ratios of the mixed gas containing the gas including the straight chain saturated hydrocarbon and the gas including the nitrogen component and the gas including the compound including carbon, nitrogen and hydrogen, the angle of the forward taper cross-section and the RIE lag characteristic can be controlled. The compound including carbon, nitrogen and hydrogen may be methylamine.

In the method for etching an organic film, the first gas is preferably a methane gas and the second gas is preferably a nitrogen gas.

In this manner, a recess with a vertical or forward taper cross-section can be definitely formed in the organic film with a very small RIE lag characteristic.

In the method for etching an organic film, the etching gas preferably further contains a rare gas.

In this manner, a deposition formed on the inner walls of a reaction chamber used for the etching can be reduced.

The method for fabricating a semiconductor device of this invention comprises the steps of forming an organic film on a semiconductor substrate; forming, on the organic film, a mask pattern including an inorganic compound as a principal constituent; and forming a recess in the organic film by selectively etching the organic film by using the mask pattern and by using plasma generated from an etching gas containing a first gas including a straight chain saturated hydrocarbon and a second gas including a nitrogen component.

In the present method for fabricating a semiconductor device, an organic film is etched by using plasma generated from the mixed gas containing the gas including hydrocarbon and the gas including a nitrogen component, namely, a semiconductor device is fabricated by the present method for etching an organic film. Therefore, a recess with a vertical or forward taper cross-section can be formed in the organic film with a very small RIE lag characteristic.

Accordingly, even when a fine pattern is to be formed, a process margin such as allowance in etching amount can be large, and even when holes with different diameters or interconnect grooves with different widths are to be formed together, excessive or insufficient etching can be avoided, so as to substantially uniformly etch underlying films. As a result, the reliability of the semiconductor device can be improved.

In the method for fabricating a semiconductor device, the etching gas preferably further contains a gas including a compound including carbon, nitrogen and hydrogen.

In this manner, a recess to be formed can attain a forward taper cross-section with keeping the very small RIE lag characteristic, and the angle of the forward taper cross-section and the RIE lag characteristic can be controlled by adjusting the mixing ratio, in the etching gas, of the gas including the compound including carbon, nitrogen and hydrogen. The compound including carbon, nitrogen and hydrogen may be methylamine.

In the method for fabricating a semiconductor device, the recess preferably includes a via hole and an interconnect groove formed above the via hole and is filled with a metal material film by a dual damascene method.

In this manner, the recess including the via hole and the interconnect groove formed above the via hole, the via hole in particular, can attain a forward taper cross-section with keeping the very small RIE lag characteristic. As a result, good electric connection can be attained between a connection plug and a lower metal interconnect disposed below the connection plug formed by the dual damascene method. Thus, the electric characteristic of a multi-level interconnect structure formed by the dual damascene method can be improved.

In the method for fabricating a semiconductor device, the first gas is preferably a methane gas and the second gas is preferably a nitrogen gas.

In this manner, a recess with a vertical or forward taper cross-section can be definitely formed in the organic film with a very small RIE lag characteristic.

In the method for fabricating a semiconductor device, the etching gas preferably further contains a rare gas.

In this manner, a deposition formed on the inner walls of a reaction chamber used for the etching can be reduced.

The pattern formation method for this invention comprises the steps of forming an organic film on a substrate; forming, on the organic film, a mask layer including an inorganic component; and forming an organic film pattern from the organic film by selectively etching the organic film by using the mask layer and by using plasma generated from an etching gas containing a first gas including a straight chain saturated hydrocarbon and a second gas including a nitrogen component.

In the present pattern formation method, the organic film pattern is formed by conducting selective etching on the organic film by using plasma generated from the etching gas containing the gas including a straight chain saturated hydrocarbon and the gas including a nitrogen component, namely, the organic film pattern is formed by the method for etching an organic film of this invention. Therefore, an opening formed in the organic film pattern can be prevented from having a larger dimension than an opening of the mask layer, and an opening with a vertical or forward taper cross-section can be formed in the organic film pattern with a very small RIE lag characteristic. Accordingly, a mask pattern can be highly precisely formed with a large process margin.

In the pattern formation method, the etching gas preferably further contains a gas including a compound including carbon, nitrogen and hydrogen.

In this manner, with keeping the very small RIE lag characteristic, the opening of the organic film pattern can attain a forward taper cross-section, and the angle of the forward taper cross-section and the RIE lag characteristic can be controlled by adjusting the mixing ratio, in the etching gas, of the gas containing the compound including carbon, nitrogen and hydrogen. The compound including carbon, nitrogen and hydrogen may be methylamine.

In the pattern formation method, the first gas is preferably a methane gas and the second gas is preferably a nitrogen gas.

In this manner, a recess with a vertical or forward taper cross-section can be definitely formed in the organic film pattern with a very small RIE lag characteristic.

In the pattern formation method, the etching gas preferably further contains a rare gas.

In this manner, a deposition formed on the inner walls of a reaction chamber used for the etching can be reduced.

In the pattern formation method, the mask layer is preferably a silylated layer.

In this manner, an opening with a vertical or forward taper cross-section can be formed in the organic film pattern with a very small RIE lag characteristic by the top surface imaging process.

BRIEF DESCRIPTION OF THE DRAWINGS

FIGS. 2A, 2B, 2C and 2D are cross-sectional SEM photographs of holes formed in an organic film by the method for etching an organic film of Embodiment 1;

FIGS. 5A and 5B are cross-sectional SEM photographs of holes formed by a method for etching an organic film according to Embodiment 4 of the invention, wherein FIG. 5A shows a hole formed by singly using a $CH_3NH_2$ gas and FIG. 5B shows a hole formed by using a mixed gas of a $CH_4$ gas and a $N_2$ gas;

FIGS. 6A and 6B show the RIE lag characteristics of the method for etching an organic film of Embodiment 4, wherein FIG. 6A shows the RIE lag characteristic obtained by singly using a $CH_3NH_2$ gas and FIG. 6B shows the RIE lag characteristic obtained by using a mixed gas of a $CH_4$ gas and a $N_2$ gas;

FIGS. 7A, 7B and 7C are cross-sectional views of holes formed by the method for etching an organic film of Embodiment 4, wherein FIG. 7A shows a hole formed in setting a flow rate of a $CH_3NH_2$ gas<<a flow rate of a ($CH_4+N_2$) gas, FIG. 7B shows a hole formed in setting the flow rate of the $CH_3NH_2$ gas>>the flow rate of the ($CH_4+N_2$) gas and FIG. 7C shows a hole formed in setting the flow rate of the $CH_3NH_2$ gas=the flow rate of the ($CH_4+N_2$) gas;

DETAILED DESCRIPTION OF THE INVENTION

EMBODIMENT 1

A method for etching an organic film according to Embodiment 1 of the invention will now be described with reference to FIGS. 1, 2A through 2D, 3A through 3E, 5A and 5B.

In the method for etching an organic film of Embodiment 1, a mixed gas including, as principal constituents, a $CH_4$ gas and a $N_2$ gas is used as the etching gas, so as to etch an organic film with plasma generated from the mixed gas. Exemplified etching conditions in Embodiment 1 are:

Plasma etching system: NLD plasma etching system
Type of etching gas and flow rates per minute in standard condition:

$CH_4:N_2$=30 ml:70 ml

Figure 1:
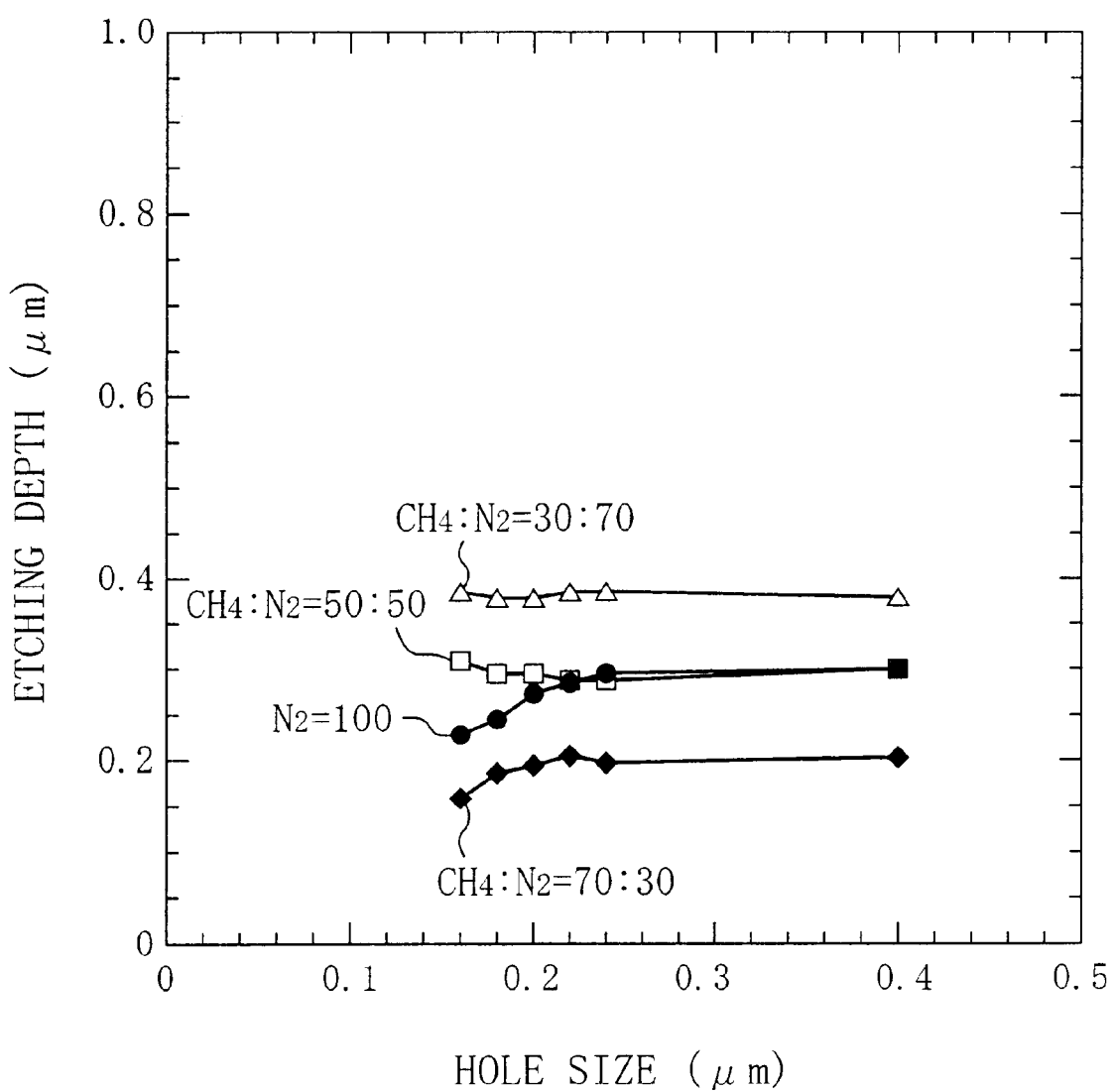
FIG. 1 is a diagram of the RIE lag characteristic of a method for etching an organic film according to Embodiment 1 of the invention.

Antenna power: 1000 W (13.56 MHz)
Bias power: 200 W (2 MHz)
Pressure: 0.4 Pa
Substrate cooling temperature: 0° C.
Etching time: 180 seconds FIG. 1 is a diagram for explaining the RIE lag characteristic of the method for etching an organic film of this embodiment, which is obtained by etching an organic film with a thickness of approximately 1.2 µm by using a mask pattern of a silicon oxide film with a thickness of approximately 240 nm. FIG. 1 also shows the RIE lag characteristics obtained when the ratio in the flow rate (ml) per minute in the standard condition between the $CH_4$ gas and the $N_2$ gas included in the etching gas, namely, $CH_4:H_2$, is 50 ml:50 ml, 70 ml:30 ml or 0 ml:100 ml.

As is understood from FIG. 1, the RIE lag characteristic is abrupt in forming a hole with a diameter of 0.2 µm or less when $CH_4:N_2$ is 0 ml:100 ml.

Also, when $CH_4:N_2$ is 70 ml:30 ml, the RIE lag characteristic is observed and the etching rate is lowered as a whole because of a high concentration of the $CH_4$ gas. The reason why the etching rate is lowered when the concentration of the $CH_4$ gas is high will be described below with reference to FIGS. 4A and 4B.

When $CH_4:N_2$ is 50 ml:50 ml, the so-called inverse RIE lag that the etching rate is increased as the diameter of a hole is smaller is observed.

On the other hand, when $CH_4:N_2$ is 30 ml:70 ml, no RIE lag is caused, substantially a constant etching rate is obtained in all the holes having a diameter of 0.16 µm through 0.4 µm, and the etching rate is improved. In general, it is understood that a reaction is the most efficiently proceeded in an etch target surface when the etching rate is maximum, namely, when $CH_4:N_2$ is 30 ml:70 ml.

FIGS. 2A through 2D are cross-sectional SEM photographs of holes formed in an organic film by the etching method for Embodiment 1, and the holes of FIGS. 2A through 2D have diameters of 0.16 µm, 0.18 µm, 0.24 µm and 0.40 µm, respectively. In FIGS. 2A through 2D, a reference numeral 1 denotes a silicon substrate, a reference numeral 2 denotes an organic film with a thickness of approximately 1.2 µm, and a reference numeral 3 denotes a mask pattern of a silicon oxide film with a thickness of approximately 240 nm. At the beginning of the etching, a resist pattern with a thickness of approximately 0.4 µm is present on the mask pattern 3, and is eliminated during the etching of the organic film 2.

As is understood from FIGS. 2A through 2C, when a hole has a diameter of 0.16 µm, 0.18 µm or 0.24 µm, a vertical cross-section can be obtained, and as is understood from FIG. 2D, when a hole has a diameter of 0.40 µm, a forward taper cross-section can be obtained.

FIGS. 3A through 3E are cross-sectional SEM photographs of holes for showing the relationship, obtained in the pattern formation method for Embodiment 1, between the mixing ratios of the $CH_4$ gas and the $N_2$ gas included in the etching gas and the cross-sectional shape of a hole with a diameter of 0.24 µm. FIGS. 3A through 3E show the cross-sections of the holes formed when the ratios in the flow rate (ml) per minute in the standard condition between the $CH_4$ gas and the $N_2$ gas in the etching gas, namely, $CH_4:N_2$, are 0 ml:100 ml, 30 ml:70 ml, 50 ml:50 ml, 70 ml:30 ml and 100 ml:0 ml, respectively. In any cases, the etching is carried out under the aforementioned etching conditions. In FIGS. 3A through 3E, a reference numeral 1 denotes a silicon substrate, a reference numeral 2 denotes an organic film, a reference numeral 3 denotes a mask pattern of a silicon oxide film, a reference numeral 4 denotes a resist pattern and reference numerals 5 and 6 denote depositions.

Figure 3A:
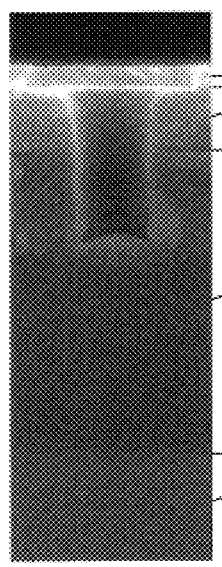
FIGS. 3A, 3B, 3C, 3D and 3E are cross-sectional SEM photographs of holes formed by a method for forming an organic film pattern according to Embodiment 1 for showing the relationship between mixing ratios of a $CH_4$ gas and a $N_2$ gas in an etching gas and the cross-sectional shape of a hole with a diameter of 0.24 $\mu$m.
Figure 3B:
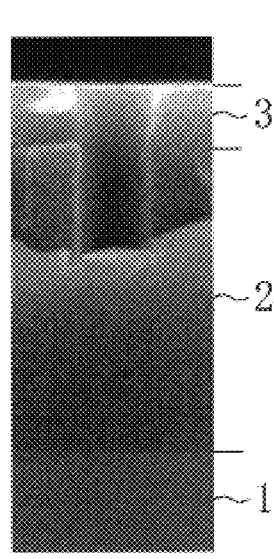

As is understood from comparison of FIG. 3B with FIGS. 3A, 3C, 3D and 3E, the resist pattern 4 is removed through the etching only when $CH_4:N_2$ is 30 ml:70 ml.

Figure 3C:
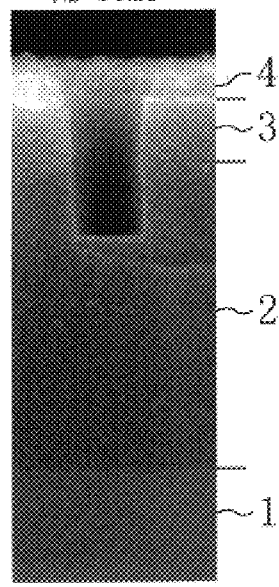
Figure 3D:
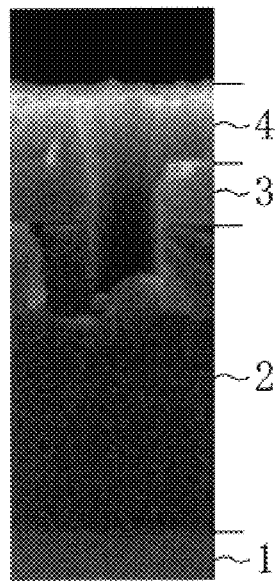

As is understood from FIGS. 3C and 3D, when the etching gas includes 50% or more of the $CH_4$ gas, the resist pattern 4 remains and the etching rate is lowered.

Figure 3E:
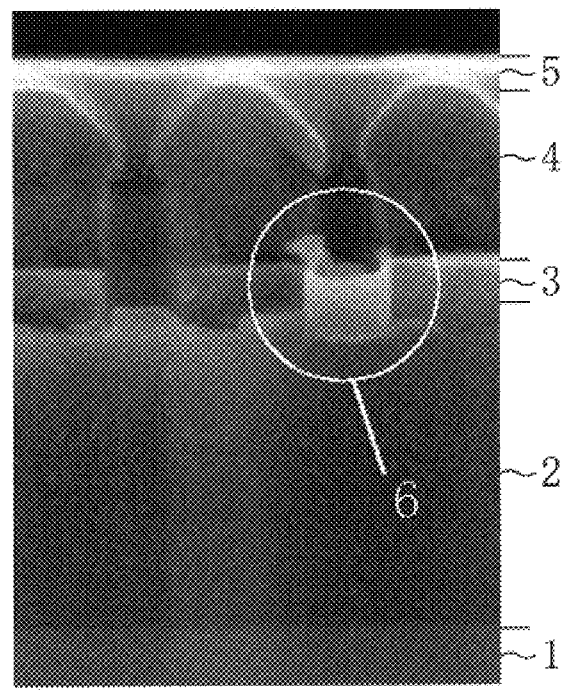

As is understood from FIG. 3E, when 100% of the etching gas is the $CH_4$ gas, the resist pattern 4 is not etched and the depositions 5 and 6 are formed. Specifically, after a hole is formed by etching the organic film 2 to some extent, the deposition 6 is deposited within the hole.

The phenomena shown in FIGS. 3A through 3E reveal the following: If the resist pattern 4 can remain after completing the etching of the organic film 2, the etching conditions can be selected from a wide range where the amount of the $CH_4$ gas to be added to the etching gas is approximately 70% or less. Alternatively, when the resist pattern 4 cannot remain after completing the etching of the organic film 2, the amount of the $CH_4$ gas to be added to the etching gas is set to a range having approximately 30% as the center for not allowing the resist pattern 4 to remain.

The holes of FIGS. 3A through 3E are obtained when the etching time is 180 seconds. In actual fabrication of a semiconductor device, namely, when over-etching is carried out, the etching time is longer than 180 seconds. Therefore, the range of the amount of the $CH_4$ gas to be added for not allowing the resist pattern 4 to remain is further enlarged. Depending upon an actually employed etching process, the amount of the $CH_4$ gas to be added may be 0% (shown in FIG. 3A) or 50% (shown in FIG. 3C).

Figure 4A:
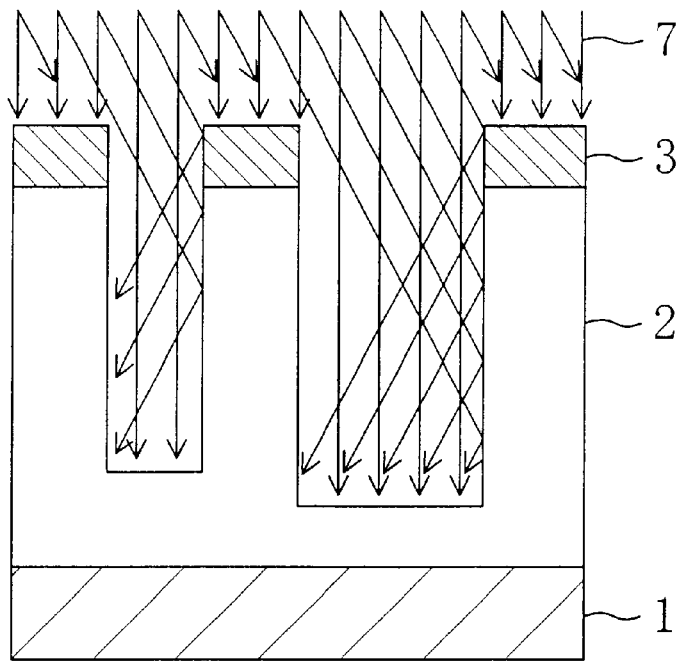
FIG. 4A is a diagram for explaining the mechanism of a conventional method for etching an organic film and FIG. 4B is a diagram for explaining the mechanism of the method for etching an organic film of Embodiment 1.
Figure 4B:
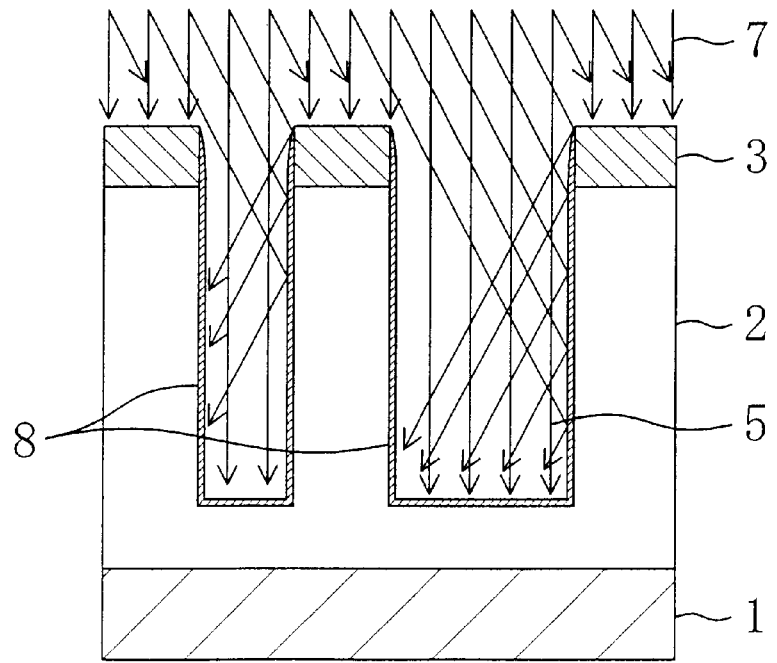

FIGS. 4A and 4B are diagrams for explaining an effect of the etching method for this embodiment, wherein FIG. 4A shows the etching mechanism obtained in using a conventional etching gas of a mixed gas including $N_2$ and $H_2$ or a $NH_3$ gas, and FIG. 4B shows the etching mechanism obtained in using the etching gas of Embodiment 1 of the mixed gas including $CH_4$ and $N_2$. In FIGS. 4A and 4B, a reference numeral 1 denotes a silicon substrate, a reference numeral 2 denotes an organic film to be etched, a reference numeral 3 denotes a mask pattern of a silicon oxide film, a reference numeral 7 denotes a radical flux isotropically reaching the organic film 2, and a reference numeral 8 denotes deposition film formed on the wall and the bottom of a recess formed in the organic film 2 by the etching.

In general, in conducting anisotropic etching by using plasma, the etching is mainly realized by proceeding an ion assisted etching reaction, and is minimally proceeded by chemical sputtering, physical sputtering and a thermochemical reaction as compared with the ion assisted etching reaction. In the ion assisted reaction, when ions are released from the plasma to reach an etch target film, the ions are accelerated by an electric field of a plasma sheath region formed between a plasma generation region and the etch target film so as to collide with the etch target film, resulting in proceeding a surface chemical reaction in the vicinity of collision portions by collision energy. The mechanism of the etching through the ion assisted reaction is roughly divided into the following two types:

First Etching Mechanism

In the first mechanism, reactive radicals participating in the etching reaction are physically or chemically adsorbed onto the etch target surface, and this mechanism is further classified into the following three cases:

In the first case, ions collide with the vicinity of the portion where the radicals are adsorbed, so as to cause a chemical reaction among the ions, the adsorbed substance and the material of the etch target film.

In the second case, the adsorption is further proceeded so as to form a thin deposition film on the etch target surface, and also in this case, the ion assisted reaction can be efficiently proceeded through the ion collision, resulting in attaining a high etching rate.

In the third case, the deposition film has a large thickness, and in this case, most of ions reaching the etch target surface are consumed in removing the deposition film, and hence, the etching rate is excessively lowered. Also, when the thickness of the deposition film is larger than a predetermined value, namely, too large to remove through the ion collision, the deposition film cannot be removed by the ions. Therefore, the chemical reaction among the ions reaching the etch target surface, the adsorbed substance and the material of the etch target film is terminated, resulting in stopping the etching.

Second Etching Mechanism

In the second mechanism, no reactive radicals participating in the etching reaction is adsorbed onto the etch target surface. In this case, ions collide with the etch target surface and cause a chemical reaction with the material of the etch target film directly by the energy of the ions themselves, so as to proceed the ion assisted etching reaction.

In the case where the plasma generated from the mixed gas including $N_2$ and $H_2$, radicals (hereinafter, reactive neutral particles with activity including atoms are generally designated as radicals) generated in the plasma are considered to be N, $N_2$, H and $H_2$, and in the case where the plasma of a $NH_3$ gas is used, generated radicals are considered to be not only N, $N_2$, H and $H_2$ but also NH, $NH_2$ and $NH_3$. Therefore, when the $NH_3$ gas is used, the amount of generated radicals is larger as compared with the case where the mixed gas of $N_2$ and $H_2$ is used, and hence, the amount of substances adhered onto the etch target surface is probably increased. However, the adsorbed substance is not resistant to the collision of ions emitted from the plasma to the etch target surface, and hence, a deposition film is not formed on the etch target surface.

Accordingly, the etching reaction occurring on the etch target surface on the bottom of the recess is probably dominantly a reaction to etch a small amount of atoms or molecules adhered onto the etch target surface and atoms present on the surface of the organic film by the ion assisted reaction caused by the ions emitted from the plasma (by the mechanism of the first case of the first etching mechanism), or an etching reaction between the ions and the etch target surface (by the second etching mechanism). In particular, in the etching by using the conventional plasma of $N_2$ and $H_2$, the etching is probably dominantly proceeded by the second etching mechanism.

Since a hydrogen ion is small in its atomic radius and inertial mass, it probably enters the inside of the organic film without causing a reaction when it reaches the etch target surface. Therefore, it seems that nitrogen ions and ions of ammonia fragments (molecules and atoms generated through dissociation and decomposition from ammonia molecules) are the prime cause for proceeding the ion assisted reaction.

In general, an organic film includes, as a principal constituent, a polymer consisting of carbon atoms and hydrogen atoms, and the organic film is etched by nitrogen or hydrogen radicals and ions reaching the organic film as in Conventional Example 1. Therefore, it seems that a principal reaction product generated in the etching is volatile HCN and that the etching is proceeded by releasing the HCN from the etch target surface.

In general, the radical flux is lowered in the bottom of a recess having a higher aspect ratio. In contrast, ions comparatively constantly reach the bottom of a recess substantially regardless of the aspect ratio of the recess.

Accordingly, the etching rate is lowered in a recess having a higher aspect ratio where the radical flux is lowered, namely, a recess having a smaller diameter. This is the prime cause of the RIE lag. To be extract, the RIE lag may also be caused by the ion flux lowered depending upon the aspect ratio.

On the contrary, when the plasma generated from the mixed gas including $CH_4$ and $N_2$ is used as in Embodiment 1, radicals of N, $N_2$, C, H, CH, $CH_2$, $CH_3$ and $CH_4$ are generated. Specifically, Embodiment 1 is different from Conventional Example 1 in a first point that there exist radicals of $CH_x$ (wherein x is 1, 2, 3 or 4). These $CH_x$ radicals tend to form a polymer on the etch target surface, and hence, the deposition film 8 is formed on the etch target surface, so as to fix atoms required for the etching reaction onto the etch target surface. The deposition film 8 with an appropriate thickness has a function as a reaction layer, so as to serve as the prime cause for efficiently causing the ion assisted reaction (by the mechanism of the second case of the first etching mechanism).

In Embodiment 1, the etching gas of the mixed gas including the $CH_4$ gas and the $N_2$ gas is used, the deposition film 8 is formed on the etch target surface, and the deposition film 8 fixes atoms required for the etching reaction onto the etch target surface. Therefore, the deposition film 8 has a function to compensate the phenomenon that the radical flux is lowered on the bottom of a recess with a higher aspect ratio.

Also, as described above, the ions comparatively constantly reach the bottom of a recess substantially regardless of the aspect ratio.

Accordingly, substantially without depending upon the aspect ratio, the ion assisted reaction is caused on the bottom of the recess, so that the constant etching rate can be obtained regardless of the aspect ratio, namely, the diameter of the opening.

When the aforementioned phenomena are more strictly observed, the radical flux reaching the bottom of a recess is actually lowered as the aspect ratio of the recess is higher, and hence, the thickness of the deposition film formed onto the bottom of the recess is varied in accordance with the proceeding of the etching. Accordingly, as is shown in FIG. 1, different RIE lag characteristics are observed depending upon the mixing ratios of the $CH_4$ gas and the $N_2$ gas.

Now, the influence of the mixing ratios of the $CH_4$ gas and the $N_2$ gas in the etching gas upon the RIE lag characteristic will be described in more detail.

First, in the case where no $CH_4$ gas is added, namely, when the etching gas includes the $N_2$ gas alone, a conspicuous RIE lag characteristic is observed for the same reason as in Conventional Example 1.

Next, in the case where the $CH_4$ gas is included in approximately 30%, the RIE lag characteristic is not observed for the following reason: Since the radical flux reaching the bottom of a recess is lowered as the aspect ratio of the recess is higher, although the thickness of the deposition film 8 depends upon the diameter of the recess, the deposition film 8 in an amount equal to or sufficiently larger than an amount consumed in the ion assisted reaction is formed on the bottom of a recess having a small diameter. Therefore, a substantially constant etching rate is obtained without depending upon the diameter of the recess, namely, the aspect ratio. This fact paradoxically reveals that the surface adsorption coefficient (surface adsorption probability) of the $CH_x$ radicals is small and that the transfer loss to the inside of a hole or interconnect groove with a high aspect ratio is considerably small.

Next, in the case where the $CH_4$ gas is included in approximately 50%, the amount of radicals that can reach the etch target surface on the bottom of a recess basically from the uppermost face of the substrate (namely, the surface of the mask pattern 3) depends upon the aspect ratio, and when the amount of radicals supplied onto the uppermost face of the substrate is increased, the amount of the radicals reaching the bottom of the recess is naturally increased. At this point, part of ions reaching the bottom of the recess are consumed in removing an excessive deposition, and hence, the etching rate is lowered as a whole. Furthermore, as the aspect ratio is lower, namely, as the diameter of the opening is larger, the deposition film 8 is formed on the bottom of the recess in an amount larger than the amount necessary for the ion assisted reaction. Accordingly, as the deposition film 8 has a larger thickness, a larger part of the ions reaching the bottom of the recess is consumed in removing the excessive deposition film 8. As a result, the amount of ions consumed in removing the deposition film 8 is smaller in a recess with a smaller diameter than in a recess with a larger diameter, and therefore, the so-called inverse RIE lag phenomenon that the etching rate of a recess with a smaller diameter is larger than the etching rate of a recess with a larger diameter is observed.

Next, the case where the $CH_4$ gas is included in approximately 70% will be examined. As described with respect to the etching method for Conventional Example 1 referring to FIG. 4A, ions of nitrogen atoms or nitrogen molecules are the prime cause for proceeding the ion assisted reaction. When the etching gas includes 70% of the $CH_4$ gas, the supply amount of the $N_2$ gas is naturally reduced, and hence, the amount of generated ions of nitrogen atoms or nitrogen molecules serving as the prime cause of the ion assisted reaction is reduced. Accordingly, the reduced amount of the ions of nitrogen atoms or nitrogen molecules also lowers the etching rate when the amount of the $CH_4$ gas to be added is increased.

Furthermore, when the $CH_4$ gas is included in approximately 70%, the thickness of the deposition film 8 is further increased, and hence, a larger amount of ions are consumed in removing the deposition film 8. In addition, since the supply amount of the $N_2$ gas indispensable to the etching reaction is reduced, the etching rate is further lowered as a whole. Simultaneously, as is understood from FIG. 3D, the resist pattern 4 formed on the mask pattern 3 of the silicon oxide film is minimally etched. Accordingly, when the etching is proceeded to some extent, the aspect ratio is excessively increased in a recess with a small diameter, so that the amounts of radicals and ions supplied to the bottom of the recess can be abruptly reduced. Therefore, the etching rate of the recess with a small diameter is excessively lowered. As a result, in the case where the $CH_4$ gas is included in 70% in which the resist pattern 4 is minimally etched, the RIE lag occurs again.

EMBODIMENT 2

A method for etching an organic film according to Embodiment 2 of the invention will now be described.

In the method for etching an organic film of this embodiment, a mixed gas including, as principal constituents, a $CH_4$ gas and a $NH_3$ gas is used as the etching gas, so as to etch an organic film with plasma generated from the mixed gas. Exemplified etching conditions in Embodiment 2 are:

Plasma etching system: NLD plasma etching system

Type of etching gas and flow rates per minute in standard condition:

$CH_4:NH_3=30$ ml:70 ml

Antenna power: 1000 W (13.56 MHz)

Bias power: 200 W (2 MHz)

Pressure: 0.4 Pa

Substrate cooling temperature: 0° C.

An effect of the etching method for Embodiment 2 will now be described.

Embodiment 2 is different from Embodiment 1 in using the $NH_3$ gas instead of the $N_2$ gas, which results in attaining a higher etching rate in Embodiment 2 than in Embodiment 1.

The effect attained by adding the $CH_4$ gas to the etching gas is the lowering of the RIE lag characteristic as described in Embodiment 1.

Since the mixed gas including the $CH_4$ gas and the $NH_3$ gas as the principal constituents is used for etching an organic film in Embodiment 2, the improvement of the etching rate and the lowering the RIE lag characteristic can be both realized.

EMBODIMENT 3

A method for etching an organic film according to Embodiment 3 of the invention will now be described.

In the method for etching an organic film of Embodiment 3, a mixed gas including, as principal constituents, a $CH_4$ gas, a $N_2$ gas and a $H_2$ gas is used as the etching gas, so as to etch an organic film with plasma generated from the mixed gas. Exemplified etching conditions in Embodiment 3 are:

Plasma etching system: NLD plasma etching system

Type of etching gas and flow rates per minute in standard condition:

$CH_4:N_2:H_2=30$ ml:35 ml:35 ml

Antenna power: 1000 W (13.56 MHz)

Bias power: 200 W (2 MHz)

Pressure: 0.4 Pa

Substrate cooling temperature: 0° C.

An effect of the etching method for this embodiment will now be described.

Since the mixed gas including the $CH_4$ gas, the $N_2$ gas and the $H_2$ gas as principal constituents is used in Embodiment 3, not only a higher etching rate than in Embodiment 1 can be obtained but also the amounts of $N_2$ and $H_2$ included in the etching gas can be more precisely controlled than in Embodiment 2. Accordingly, the etching can be carried out under more preferable conditions than in Embodiments 1 and 2. Specifically, Embodiment 3 can realize a process with a large process window.

The effect attained by adding the $CH_4$ gas to the etching gas is the lowering of the RIE lag characteristic as described in Embodiment 1.

Since the mixed gas including the $CH_4$ gas, the $N_2$ gas and the $H_2$ gas as the principal constituents is used for etching an organic film in Embodiment 3, not only the improvement of the etching rate and the lowering of the RIE lag characteristic can be both realized but also the controllability of the etching and the process window can be increased.

EMBODIMENT 4

A method for etching an organic film according to Embodiment 4 of the invention will now be described with reference to FIGS. 5A, 5B, 6A, 6B, 7A through 7C and 8.

In the method for etching an organic film of Embodiment 4, a mixed gas including, as principal constituents, a $CH_4$ gas, a $N_2$ gas and a $CH_3NH_2$ (methylamine) gas is used as the etching gas, so as to etch an organic film with plasma generated from the mixed gas. Exemplified etching conditions in Embodiment 4 are:

Plasma etching system: NLD plasma etching system

Type of etching gas and flow rates per minute in standard condition:

$CH_4:CH_3NH_2:N_2$=15 ml:50 ml:35 ml

Antenna power: 1000 W (13.56 MHz)
Bias power: 200 W (2 MHz)
Pressure: 0.4 Pa
Substrate cooling temperature: 0° C.

Now, an effect of the method for etching an organic film of Embodiment 4 will be described in contradiction to etching of an organic film by using an etching gas including a $CH_3NH_2$ gas as a principal constituent (in a flow rate per minute in the standard condition of the $CH_3NH_2$ gas of 100 ml) and etching of an organic film by using an etching gas including a $CH_4$ gas and a $N_2$ gas as principal constituents (in a ratio in the flow rate per minute in the standard condition between $CH_4$ and $N_2$ of 30 ml:70 ml). The plasma etching system, the antenna power, the bias power, the pressure and the substrate cooling temperatures are the same in all the etching as those employed in Embodiment 4.

Figure 5A:
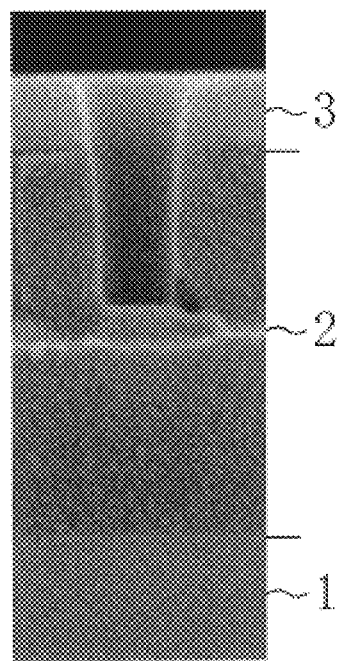
Figure 5B:
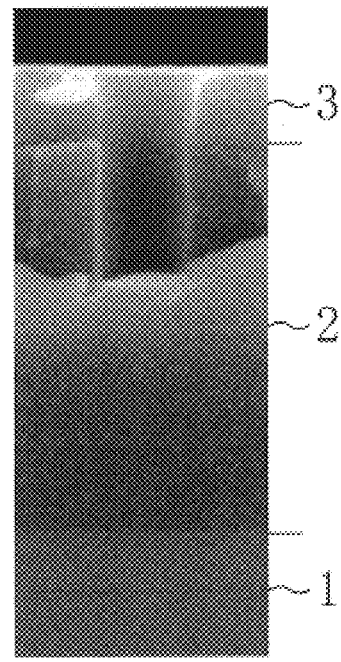

FIG. 5A is a cross-sectional SEM photograph of a hole formed by singly using the $CH_3NH_2$ gas, and FIG. 5B is a cross-sectional SEM photograph of a hole formed by using the mixed gas of $CH_4$ and $N_2$. In FIGS. 5A and 5B, a reference numeral 1 denotes a silicon substrate, a reference numeral 2 denotes an organic film, a reference numeral 3 denotes a mask pattern of a silicon oxide film, and the bottom of an opening formed in the mask pattern 3 has a diameter of 0.24 µm. A resist pattern with a thickness of approximately 0.4 µm formed on the mask pattern 3 is eliminated during the etching of the organic film 2.

Figure 6A:
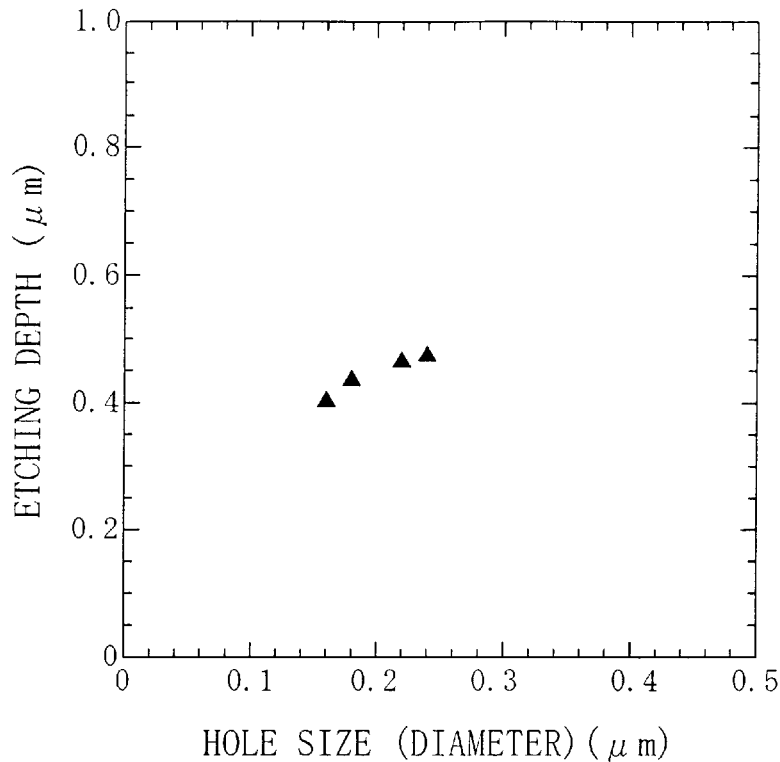
Figure 6B:
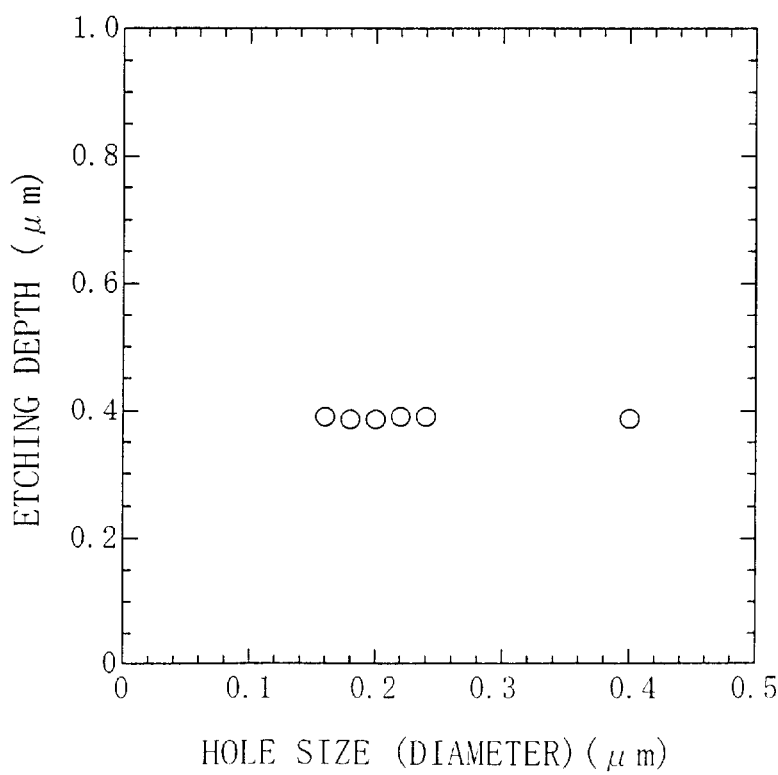

FIG. 6A shows the RIE lag characteristic obtained by singly using the $CH_3NH_2$ gas and FIG. 6B shows the RIE lag characteristic obtained by using the mixed gas of $CH_4$ and $N_2$.

When the $CH_3NH_2$ gas is singly used, the hole has a good forward taper cross-section as is understood from FIG. 5A but the RIE lag characteristic is not very good as is understood from FIG. 6A.

On the other hand, when the mixed gas of $CH_4$ and $N_2$ is used, the hole has a substantially vertical cross-section as is understood from FIG. 5B and the RIE lag characteristic is good as is understood from FIG. 6B. In other words, a constant etching rate is obtained without depending upon the diameter of the hole.

In Embodiment 4, the ratio between the constituents of the etching gas ($CH_4:CH_3NH_2:N_2$=15 ml:50 ml:35 ml) is obtained by mixing a half of the flow rate per minute of the singly used $CH_3NH_2$ gas (namely, 100 ml) and a half of the flow rates per minute of the mixed gas of $CH_4$ and $N_2$ (namely, $CH_4:NH_2$=30 ml:70 ml). Accordingly, Embodiment 4 can attain a characteristic intermediate between the characteristic obtained by singly using the $CH_3NH_2$ gas and the characteristic obtained by using the mixed gas of $CH_4$ and $N_2$.

Figure 7A:
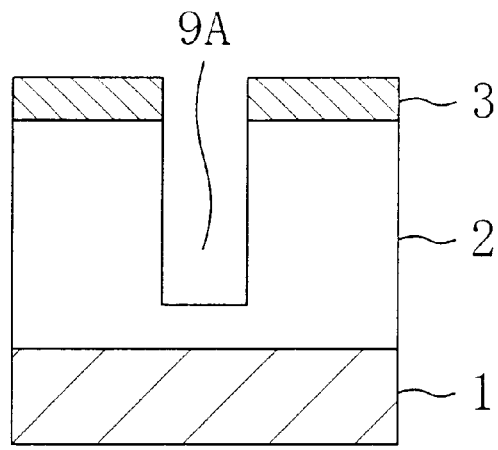
Figure 7B:
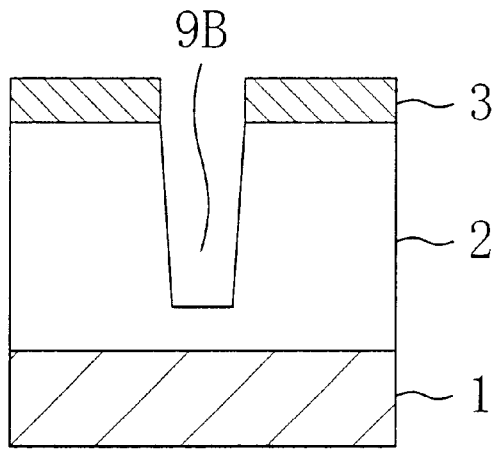
Figure 7C:
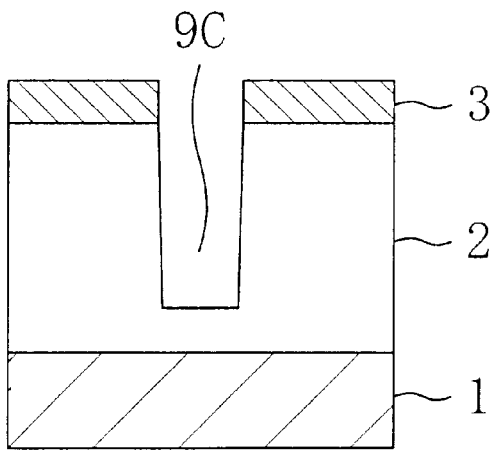

FIG. 7A shows a shape of a hole 9A expected to be formed by setting the volume flow ratio between the $CH_3NH_2$ gas and the $(CH_4+N_2)$ gas to $CH_3NH_2$<<$(CH_4+N_2)$, FIG. 7B shows a shape of a hole 9B expected to be formed by setting the volume flow ratio between the $CH_3NH_2$ gas and the $(CH_4+N_2)$ gas to $CH_3NH_2$>>$(CH_4+N_2)$, and FIG. 7C shows a shape of a hole 9C expected to be formed by setting the volume flow ratio between the $CH_3NH_2$ gas and the $(CH_4+N_2)$ gas to $CH_3NH_2$=$(CH_4+N_2)$, namely, expected in Embodiment 4.

When the $CH_3NH_2$ gas and the $(CH_4+N_2)$ gas are mixed in substantially the same volume flow ratio, it is obvious that the hole 9C has a forward taper cross-section as is shown in FIG. 7C. Also, it is understood that the angle of the forward taper cross-section can be adjusted to a desired angle by controlling the mixing ratios of the $CH_3NH_2$ gas and the $(CH_4+N_2)$ gas.

Figure 8:
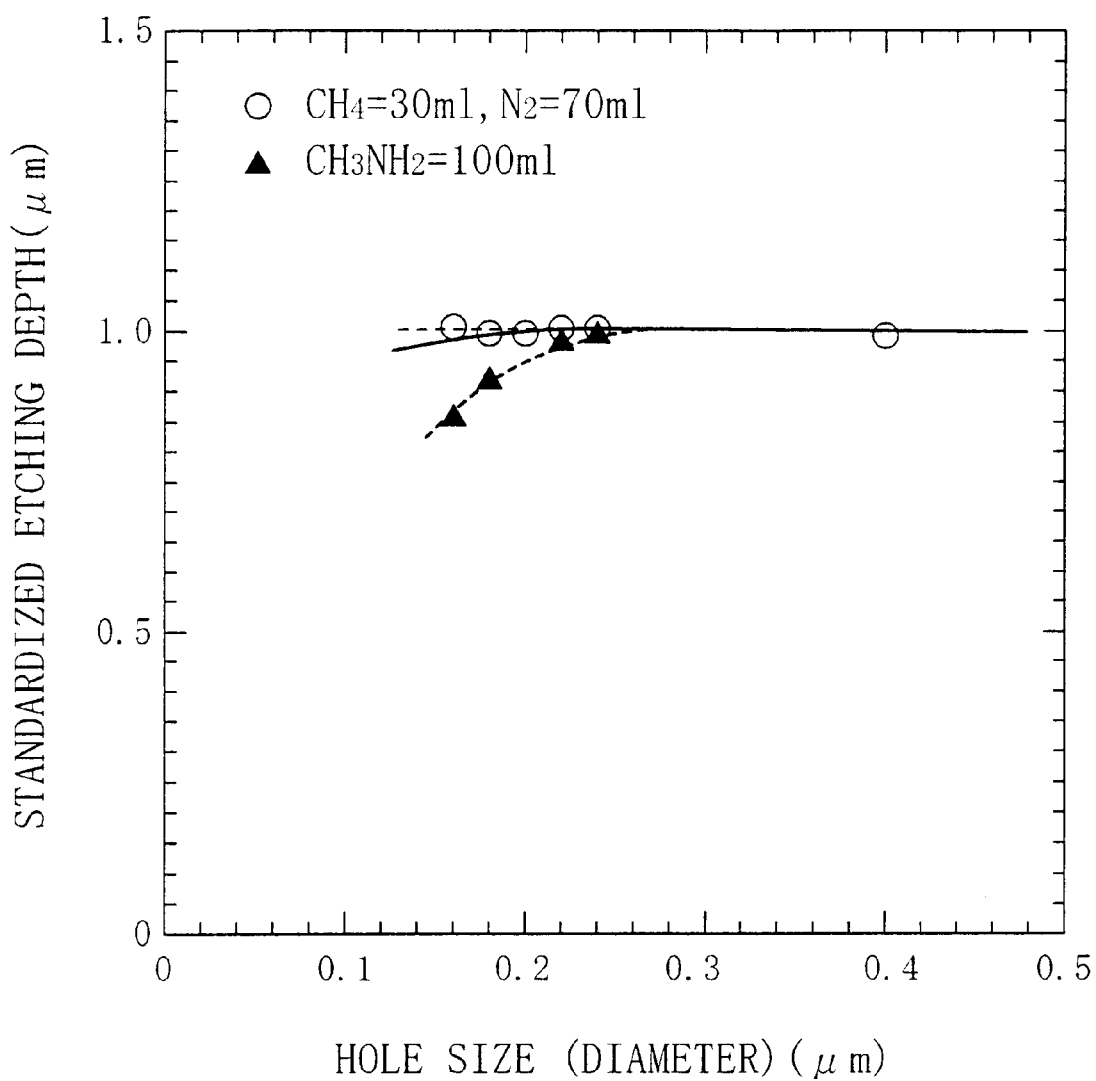
FIG. 8 is a diagram of the RIE lag characteristic of the method for etching an organic film of Embodiment 4.

FIG. 8 shows a RIE lag characteristic expected to be obtained when 100% of the etching gas is the $(CH_4+N_2)$ gas (shown with a broken line marked with ○), a RIE lag characteristic expected to be obtained when 100% of the etching gas is the $CH_3NH_2$ gas (shown with a broken line marked with ▲) and a RIE lag characteristic expected to be obtained when the etching gas includes the $CH_3NH_2$ gas and the $(CH_4+N_2)$ gas in the same ratio (shown with a solid line). In all the cases, the values are standardized to a hole diameter of 0.24 µm.

The RIE lag characteristic obtained by using 100% of the $CH_3NH_2$ gas is not very good, but the RIE lag characteristic can be improved by mixing the $CH_3NH_2$ gas with the $(CH_4+N_2)$ gas. Also, a desired RIE lag characteristic can be obtained by controlling the mixing ratios of the $CH_3NH_2$ gas and the $(CH_4+N_2)$ gas.

As described so far, since the etching gas including the $CH_3NH_2$ gas and the $(CH_4+N_2)$ gas is used in Embodiment 4, a forward taper cross-section of a hole and a small RIE lag characteristic can be both realized. Also, the angle of the forward taper cross-section and the RIE lag characteristic can be controlled by adjusting the mixing ratios of the $CH_3NH_2$ gas and the $(CH_4+N_2)$ gas.

There is a relationship between the angle of the forward taper cross-section and the RIE lag characteristic that one is improved when the other is degraded, namely, there is a reciprocal relationship therebetween. Specifically, under conditions for increasing the angle of the forward taper cross-section, the RIE lag characteristic is increased, and under conditions for reducing the angle of the forward taper cross-section, the RIE lag characteristic is reduced.

However, an actually required taper cross-section is a vertical cross-section or a slightly forward taper cross-section (an ideal taper angle is generally considered to be 89 degrees). Therefore, when the $(CH_4+N_2)$ gas is mixed with the $CH_3NH_2$ gas in an amount slightly smaller than that of the $(CH_4+N_2)$ gas, a taper cross-section derived from the $CH_3NH_2$ gas and a very small RIE lag characteristic (shown with the solid line in FIG. 8) derived from the $(CH_4+N_2)$ gas can be both realized.

Although the $CH_3NH_2$ (methylamine) gas is mixed with the $CH_4$ gas and the $N_2$ gas in Embodiment 4, the same characteristic as that obtained by mixing methylamine can be obtained by mixing one of or a combination of gases containing, as a principal constituent, a compound including carbon, hydrogen and nitrogen, such as dimethylamine (($CH_3$)$_2$NH), trimethylamine (($CH_3$)$_3$N) and triethylamine ($C_2H_5NH_2$). Methylamine, dimethylamine, trimethylamine and triethylamine can be very conveniently used because they can be taken out as a gas at a pressure of 1 atm and a temperature of 25° C. (room temperature). The boiling points of methylamine, dimethylamine, trimethylamine and triethylamine are −6.3° C., +7.4° C., +2.9° C. and +16.6° C., respectively.

Alternatively, the $CH_3NH_2$ (methylamine) gas may be replaced with any of propylamine ($C_3H_7NH_2$), a gas of the nitrile family such as $C_2H_3N$, $C_3H_3N$ and $C_3H_5N$, a gas of the diamine family such as $C_2H_8N$, and a gas including four or more carbon atoms such as $C_4H_5N$, $C_4H_7N$, $C_4H_{11}N$, $C_5H_7N$ and $C_5H_9N$.

The etching method for any of Embodiments 1 through 4 provides a high performance process. A process optimal to the environment is preferably selected in comprehensive consideration of the requirement for fine processing (the degree of refinement) in semiconductor fabrication, a fabrication cost (such as an employed gas supply system and cost of employed gases) and fabrication environments (such as maintenance of a gas line and use of a system for exhausting a gas).

EMBODIMENT 5

A method for etching an organic film according to Embodiment 5 of the invention will now be described.

In the method for etching an organic film of Embodiment 5, a mixed gas including, as principal constituents, a $CH_4$ gas, a $N_2$ gas and a rare gas (such as an Ar gas) is used as the etching gas, so as to etch an organic film with plasma generated from the mixed gas. Exemplified etching conditions in Embodiment 5 are:

Plasma etching system: NLD plasma etching system

Type of etching gas and flow rates per minute in standard condition:

$CH_4:N_2:Ar=30$ ml:70 ml:200 ml

Antenna power: 1000 W (13.56 MHz )

Bias power: 200 W (2 MHz)

Pressure: 0.4 Pa

Substrate cooling temperature: 0° C.

An effect of the etching method for Embodiment 5 will now be described.

In the etching method for any of Embodiments 1 through 4, a $CH_4$ gas is mixed in the etching gas so as to realize a small RIE lag characteristic, and owing to the $CH_4$ gas, a deposition is easily adhered onto the inner walls of a reaction chamber of the etching system, which causes a problem of generation of particles.

When the etching gas further includes a rare gas as in Embodiment 5, the deposition rate of the deposition formed on the inner walls of the reaction chamber can be lowered.

Now, the mechanism for lowering the deposition rate of the deposition obtained by mixing a rare gas in the etching gas will be described.

When a rare gas is mixed in the etching gas, partial pressures in the plasma of the etching gas and atoms or molecules dissociated from the etching gas can be lowered in the vicinity of the inner walls of the reaction chamber, and hence, the deposition rate of the deposition is lowered. From this point of view, any of He, Ne, Ar, Kr, Xe and Rn may be used as the rare gas.

Furthermore, when a rare gas is mixed in the etching gas, the mixed rare gas is ionized in the plasma, and the ions of the rare gas are accelerated by a plasma sheath electric field formed in the vicinity of the inner walls of the reaction chamber so as to collide with the inner walls of the reaction chamber. Therefore, the deposition deposited on the inner walls of the reaction chamber is removed through physical sputtering. From this point of view, any of Ne, Ar, Kr, Xe and Rn may be used as the rare gas. Since He is small in its inertial mass, it cannot effectively remove the deposition through the physical sputtering.

<Reason why straight chain saturated hydrocarbon is preferred as molecule including carbon and hydrogen>

In each of Embodiments 1 through 5, $CH_4$ is used as a molecule including carbon and hydrogen to be mixed in the etching gas, but the molecule including carbon and hydrogen is not limited to $CH_4$ but may be widely selected from straight chain saturated hydrocarbons.

Now, the reason why the straight chain saturated hydrocarbon is preferred as the molecule including carbon and hydrogen will be described.

In weakly ionized nonequilibrium plasma used in the fine processing, dissociation within the plasma is proceeded in proportion to the number N of collisions between molecules and electrons. Specifically, as the collision number N is larger, the dissociation is further proceeded. The collision number N is expressed as a value obtained by multiplying residence time τ of the gas molecules by a collision frequency ν (the number of times of collisions per unit time (one second)), namely, N=ν×τ, wherein τ is a value in proportion to the volume and the pressure P of a reaction chamber and in inverse proportion to an exhaust amount Q and τ=P·V/Q; and the collision frequency ν is expressed by a product of the electron density Ne of the plasma and the dissociation rate ($\sigma_{dis}·v_e$) peculiar to a molecule. Therefore, N=τ×Ne×($\sigma_{dis}·v_e$). The dissociation rate ($\sigma_{dis}·v_e$) peculiar to a molecule is determined on the basis of the dissociation cross-sectional area $\sigma_{dis}$ peculiar to the molecule and convolution of the electron speed (energy) distribution $v_e$.

Accordingly, in plasma with the same electron density and the same electron speed distribution, the proceeding of the dissociation is uniquely determined depending upon the residence time τ of a gas.

In a straight chain saturated hydrocarbon, when n→∞, H/C=2. Specifically, the H/C ratio in a straight chain saturated hydrocarbon always has a value larger than 2, namely, H/C>2.

The effects of this invention obtained because the molecule including carbon and hydrogen satisfies H/C>2 is understood as follows:

The first effect is the following: The composition ratio between carbon and hydrogen in plasma generated from a gas of the molecule including carbon and hydrogen and satisfying H/C>2 also satisfies H/C>2. Accordingly, on a time average basis, carbon and hydrogen are supplied onto an etch target surface in a ratio of H/C>2. Thus, a state where carbon is excessively supplied can be avoided on the etch target surface. As a result, a phenomenon of stopping the etching, namely, the etch stop, never occurs.

The second effect is the following: Molecules generated through dissociation in plasma are supplied onto an etch target surface in the form of ions or radicals. A molecule $C_xH_y$ (wherein x and y are positive integers, $1 \leq x \leq n$ and $1 \leq y \leq 2n+2$) generated from a gas of the molecule satisfying H/C>2 has a straight chain single bond alone.

Now, as the premise of the description of the reason why a straight chain saturated hydrocarbon exhibits the effects in the etching according to any of Embodiments 1 through 5, dissociation of a molecule proceeded in plasma will be examined.

In order to practically supply a gas to a plasma etching system, it is necessary to generate a vapor pressure minimally required for enabling a mass flow at 1 atm and room temperature. For this purpose, in a molecule represented by $C_xH_z$ (wherein x and y are positive integers), it is effective that x is equal to or smaller than approximately 5.

Therefore, by exemplifying a gas of a molecule in which the composition ratio of C is 5 or less, it will be examined how the dissociation is proceeded and what a dissociation product is generated as well as how the dissociation product affects the etching characteristics (the RIE lag characteristic and the cross-section of a hole).

(1) In straight chain saturated hydrocarbons (such as $CH_4$, $C_2H_6$, $C_4H_{10}$ and $C_5H_{12}$), a C—C bond or a C—H bond is cut through collision between molecules and electrons, and hence, an introduced gas is successively decomposed into a molecule having a smaller composition ratio of C. As a result, molecules having a straight chain C—C bond, such as $C_xH_y$, CH, $CH_2$, C and H, are generated. In particular, in the case of molecules of straight chain saturated hydrocarbons where the composition ratio x is approximately 5 or less, most of the molecules are probably decomposed into CH, $CH_2$, C and H. Such low molecular weight radicals have much lower probability to adhere onto a substance than a higher molecular weight radicals such as $C_xH_y$, and hence are supplied (transported) to an etch target surface on the bottom of a recess with a high aspect ratio. As a result, a deposition film is uniformly formed on the wall and the bottom of the recess. Accordingly, a vertical etch shape can be realized, and the etching rate does not depend upon the opening diameter or the aspect ratio, namely, etching with small RIE lag can be realized.

(2) In $C_2H_2$, $C_3H_4$, $C_4H_2$, $C_4H_4$, $C_4H_6$ and $C_5H_8$ (hereinafter referred to as a first group of hydrocarbons for convenience), H/C<1.5, and thus the H/C ratio is smaller than in the straight chain saturated hydrocarbon, and hence, a large number of molecules generated through dissociation in the plasma include a double bond. When introduced gas molecules include a double bond or a triple bond, the rate of decomposing the gas molecules is lowered in accordance with the number of the double or triple bonds. Therefore, as compared with the straight chain saturated hydrocarbon, the ratio of the amount of generated CH, $CH_2$, C and H to the amount of generated large molecules represented by $C_xH_y$ is lowered. Also, the radicals of the molecules including the double or triple bonds have larger probability to adsorb onto a substance, and hence are not supplied (transported) to the bottom of a recess with a high aspect ratio but are mainly deposited on the upper portion of the wall of the recess. Therefore, the effective aspect ratio of the recess is further increased, so that the amount of radicals supplied to the bottom of the recess can be largely reduced. As a result, the recess attains an excessively taper cross-section, which leads to shape defect, or large RIE lag is caused. Therefore, in an extreme case, the phenomenon where the etching is terminated, namely, the etch stop, is caused. Accordingly, none the first group of hydrocarbons is preferred for realizing the etching with small RIE lag.

(3) $C_3H_6$, $C_4H_8$ and $C_5H_{10}$ are classified into two types: straight chain hydrocarbon and cyclic hydrocarbon.

In straight chain $C_3H_6$, $C_4H_8$ and $C_5H_{10}$ (hereinafter referred to as a second group of hydrocarbons for convenience), the H/C ratio is 2, which accords with the H/C ratio of the straight chain saturated hydrocarbon. However, since each of these molecules includes one double bond, the ratio of the amount of generated CH, $CH_2$, C and H to the amount of generated large molecules represented by $C_xH_y$ is lowered similarly to the first group of hydrocarbons, and molecules including a double bond, such as $C_2H_4$ and $C_2H_2$, are generated. Accordingly, the supply (transportation) of the radicals to the bottom of a recess with a high aspect ratio and the formation of a deposition film are similar to those obtained by the first group of hydrocarbons. In particular, when $C_2H_4$ is generated and ions reach from the plasma with a large number of $C_2H_4$ adhered onto an etch target surface, $C_2H_4$ are bonded through ion collision, so as to easily form a polymer represented by $(CH_2)_n$. Therefore, similarly to the first group of hydrocarbons, none of the second group of hydrocarbons is preferred for realizing etching with small RIE lag.

On the other hand, cyclic $C_3H_6$, $C_4H_8$ and $C_5H_{10}$ (hereinafter referred to as a third group of hydrocarbons for convenience) are chemically bonded through a single bond alone to form saturated hydrocarbons. Also, in the third group of hydrocarbons, the H/C ratio is 2. In these molecules, the cyclic C—C bond can be easily cut through dissociation caused by electron collision, and molecules whose C—C bond is cut can easily form $C_2H_4$ or $CH_2$. In particular, $C_4H_8$ has a dissociation path to be decomposed into two $C_2H_4$ at a time, and hence, a larger amount of $C_2H_4$ or $CH_2$ are generated than in the first or second group of hydrocarbons. As described above, since the radicals of $C_2H_4$ not only have high probability to adsorb onto a substance but also are easily bonded to each other, they can be easily deposited on the upper portion of the wall of a recess without being supplied (transported) to the bottom of the recess with a high aspect ratio. Accordingly, none of the third group of hydrocarbons is preferred for realizing etching with small RIE lag.

(4) As described above, $C_2H_4$ is a molecule working as a fundamental cause for shape defect and a large RIE lag characteristic. Although it depends upon the degree of dissociation of plasma, the concentration of a supplied gas is high in plasma generally used. Accordingly, $C_2H_4$ exhibits the most serious effect to deposit on the upper portion of the wall of a recess without being supplied (transported) to the bottom of the recess with a high aspect ratio among the various hydrocarbons. Accordingly, $C_2H_4$ is not preferred not only because a vertical or forward taper cross-section cannot be obtained but also because a small RIE lag characteristic cannot be attained.

As described above, when one of or a combination of straight chain saturated hydrocarbons represented by $C_nH_{2n+1}$ (wherein n is a positive integer), such as $CH_4$, $C_2H_6$, $C_4H_{10}$ and $C_5H_{12}$, is used as the molecule including carbon and hydrogen, a recess with a vertical or forward taper cross-section can be formed with a very small RIE lag characteristic.

A gas used in the plasma etching can be optimally selected basically depending upon the method or system for exciting the plasma. As a plasma system can more highly excite the plasma, a higher molecular weight gas can be used, and hence, a gas to be used can be selected from a larger range. Specifically, when a plasma etching system capable of high excitement, such as an inductively coupled plasma etching system, a surface wave plasma etching system, an NLD plasma etching system, a capacity coupled parallel plate etching system using RF and an ECR plasma etching system, is used, a gas to be used can be selected in accordance with the actually used power (energy).

Furthermore, as the C/H ratio (composition ratio) of the molecule including carbon and hydrogen is larger, the ability to generate a deposition on the bottom of a recess is increased. Accordingly, the molecular weight and the C/H ratio are optimally selected in accordance with the density of plasma to be used.

Moreover, an organic film to be etched by the etching method for any of Embodiments 1 through 5 may include atoms such as N, O, B and S or halogen atoms such as F, Cl and Br as far as the organic film mainly has a framework of carbon and hydrogen.

Also, the effects of this invention are described in each of Embodiments 1 through 5 on the basis of the result obtained by using the etching gas in the NLD plasma etching system. However, the method for etching an organic film of any of Embodiments 1 through 5 is applicable to use of any plasma etching system, such as a parallel plate reactive ion etching system, a narrow-gap or two-frequency type parallel plate reactive ion etching system, magnetron enhanced reactive ion etching system, an inductively coupled plasma etching system, an antenna coupled plasma etching system, an electron cyclotron resonance plasma etching system and a surface wave plasma etching system.

EMBODIMENT 6

A method for fabricating a semiconductor device according to Embodiment 6 of the invention will now be described with reference to FIGS. 9A through 9C and 10A through 10C.

Figure 9A:
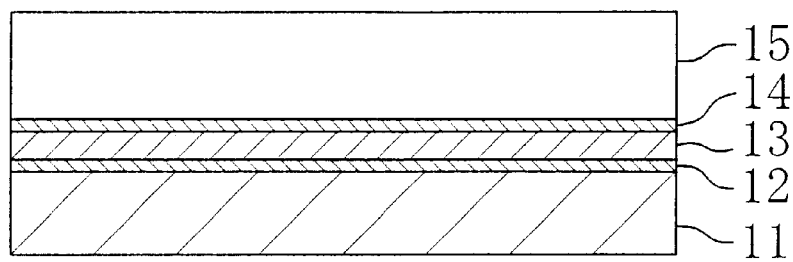
FIGS. 9A, 9B and 9C are cross-sectional views for showing procedures in a method for fabricating a semiconductor device according to Embodiment 6 of the invention.
Figure 9B:
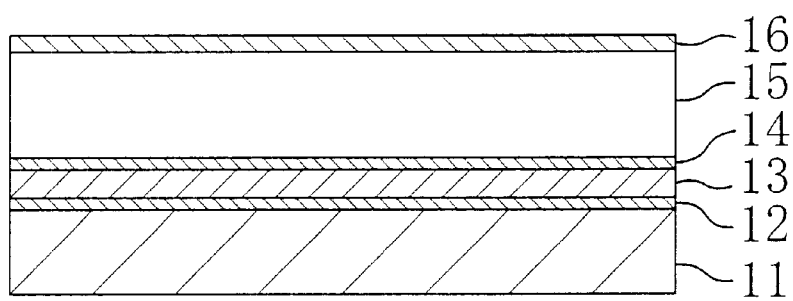

First, as is shown in FIG. 9A, a laminated metal interconnect consisting of a first barrier metal layer 12, a metal film 13 and a second barrier metal layer 14 is formed on a semiconductor substrate 11, and an organic film 15 is formed on the metal interconnect. Thereafter, a silicon oxide film 16 is formed on the organic film 15 as is shown in FIG. 9B.

Figure 9C:
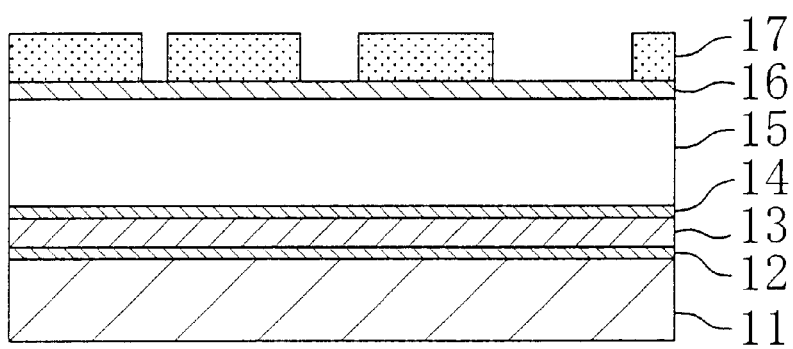
Figure 10A:
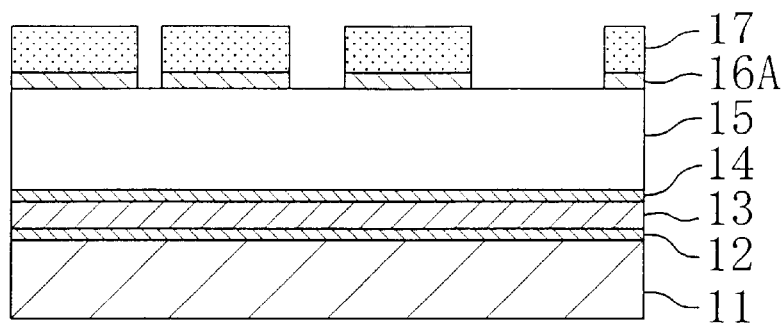
FIGS. 10A, 10B and 10C are cross-sectional views for showing other procedures in the method for fabricating a semiconductor device of Embodiment 6.

Next, after forming a resist pattern 17 on the silicon oxide film 16 by a know lithography technique as is shown in FIG. 9C, the silicon oxide film 16 is subjected to plasma etching (dry etching) by using the resist pattern 17 as a mask, thereby forming a mask pattern 16A from the silicon oxide film 16 as is shown in FIG. 10A. The type of etching gas to be used in the plasma etching is not herein specified, and a gas including fluorocarbon may be used.

Figure 10B:
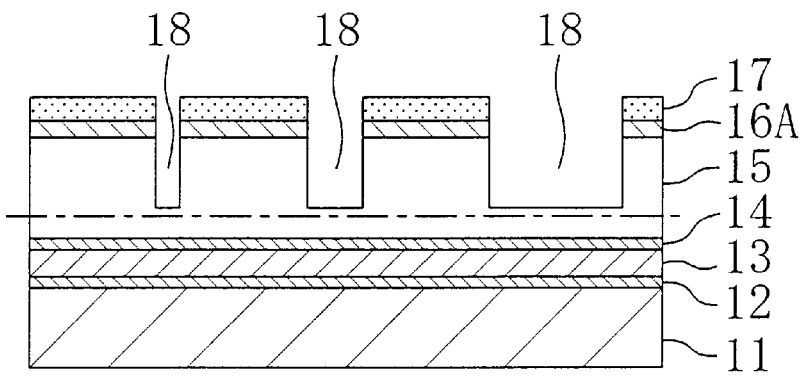
Figure 10C:
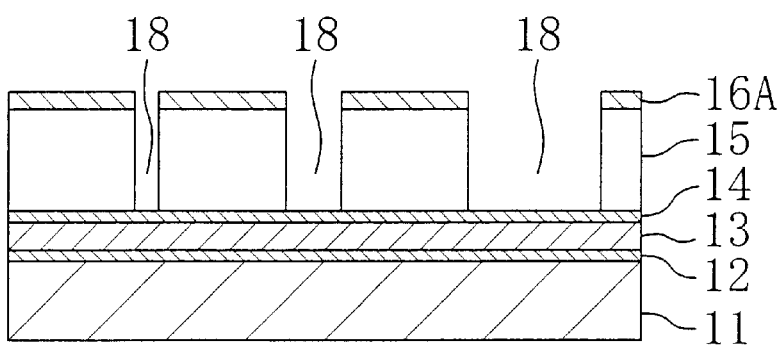

Then, the organic film 15 is subjected to plasma etching using plasma generated from the etching gas used in the etching method for any of Embodiments 1 through 5, namely, an etching gas including, as a principal constituent, a mixed gas of a molecule including carbon and hydrogen and a molecule including nitrogen, and by using the resist pattern 17 and the mask pattern 16A as masks. In this manner, recesses 18 each having a vertical or forward taper cross-section to be used as a via hole or an interconnect groove are formed in the organic film 15 as is shown in FIGS. 10B and 10C. This etching is carried out under etching conditions of any of Embodiments 1 through 5. Since the resist pattern 17 is made from an organic compound, it is removed during the etching of the organic film 15.

FIG. 10B shows a state in the middle of the etching of the organic film 15, and under the etching conditions of any of Embodiments 1 through 5, the etching can be carried out at a constant etching rate regardless of the diameters of the openings of the recesses 18. A dashed line shown in FIG. 10B corresponds to a reference line for indicating a predetermined depth in the organic film 15.

FIG. 10C shows a state where the etching of the organic film 15 is completed, and under the etching conditions of any of Embodiments 1 through 5, the etching is proceeded at substantially the same timing to the surface of the second barrier metal layer 14 regardless of the diameters of the openings of the recesses 18. Therefore, desired over-etching can be carried out regardless of the diameters of the openings of the recesses 18.

Accordingly, the organic film can be stably processed without causing excessive or insufficient etching and without depending upon the diameters of the openings of the recesses 18, and hence, a large process margin (process window) can be realized.

Thereafter, although not shown in the drawings, after cleaning the surfaces of the recesses 18 and the mask pattern 16A, a third barrier metal layer of TiN or TaN is formed on the walls of the recesses 18 by sputtering or CVD. Then, a metal material film is deposited on the entire surface of the mask pattern 16A by the CVD or plating so as to fill the recesses 18, and a portion of the metal material film exposed on the mask pattern 16A is removed by the CMP. Thus, a connection plug or metal interconnect can be formed from the metal material film. Thereafter, when a connection plug and a metal interconnect are alternately formed by a single damascene method, a multi-level interconnect structure can be obtained.

According to Embodiment 6, it is possible to prevent the problem of the excessive or insufficient etching caused in Conventional Example 2 because the etching rate of a recess with a small diameter is lower than the etching rate of a recess with a large diameter. Therefore, the reliability of a semiconductor device can be improved, and the semiconductor device can be fabricated with a large process window.

Although the connection plug or metal interconnect is formed by the single damascene method in Embodiment 6, the etching method for any of Embodiments 1 through 5 is naturally applied to a dual damascene method for simultaneously forming a connection plug and a metal interconnect. Also in this case, the reliability of a semiconductor device can be improved, and the semiconductor device can be fabricated with a large process window.

Furthermore, in Embodiment 6, the metal film 13 may be formed from, for example, a W film, an AlCu film, a Cu film, an Ag film, an Au film or a Pt film. Alternatively, the metal film 13 may be replaced with a conducting film such as a polysilicon film.

Also, in Embodiment 6, the materials for the first barrier metal layer 12 and the second barrier metal layer 14 may be selected so as to accord with the metal film 13, and for example, a laminated film including a Ti film and a TiN film or a Ta film and a TaN film may be used.

Moreover, an insulating film of a $Si_3N_4$ film or the like may be used as a barrier layer instead of the second barrier metal layer 14. In this case, the $Si_3N_4$ film is additionally etched after the etching of the organic film for forming the recesses.

Although the mask pattern 16A is formed from a silicon oxide film in Embodiment 6, a silicon nitride film may be used instead, whereas the silicon nitride film is preferably formed from a material having a smaller dielectric constant than a silicon oxide film. From this point of view, a material with a small dielectric constant such as a-SiC:H is preferably used.

Furthermore, in the case where the mask pattern 16A is also removed in removing the portion of the metal material film deposited on the mask pattern 16A exposed outside the recesses 18 by the CMP, the mask pattern 16A may be formed from a material with a large dielectric constant, such as a metal film of titanium or the like, a silicon nitride film, and a metal nitride film of titanium nitride or the like.

EMBODIMENT 7

A pattern formation method (top surface imaging process) according to Embodiment 7 of the invention will now be described with reference to FIGS. 11A through 11C, 12A and 12B.

Figure 11A:
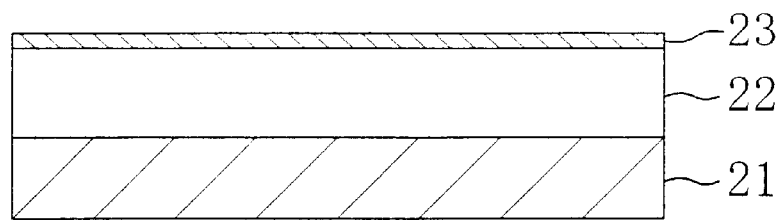
FIGS. 11A, 11B and 11C are cross-sectional views for showing procedures in a pattern formation method according to Embodiment 7 of the invention.

First, as is shown in FIG. 11A, an organic film 22 is formed on a semiconductor substrate 21, and a silylation target layer 23 is formed on the organic film 22.

Figure 11B:
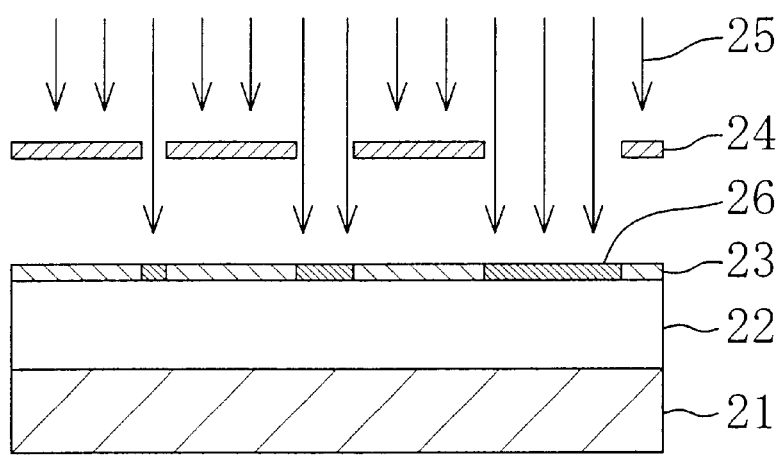

Next, as is shown in FIG. 11B, the silylation target layer 23 is irradiated with exposing light 25 through a photomask 24 for selectively allowing the light to pass, thereby selectively forming a decomposed layer 26 in the silylation target layer 23.

Figure 11C:
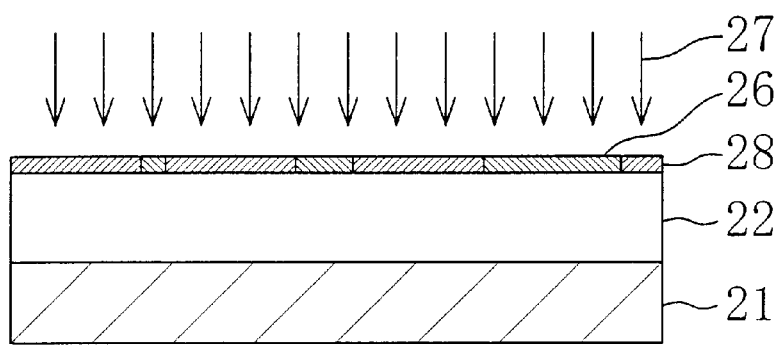

Then, as is shown in FIG. 11C, with the substrate temperature increased, a gaseous silylation reagent 27 is supplied onto the surface of the silylation target layer 23, so as to selectively silylate a non-decomposed portion (a portion excluding the decomposed layer 26) of the silylation target layer 23. Thus, a silylated layer 28 serving as a mask layer is formed.

Instead of silylating the non-decomposed portion, the decomposed layer 26 may be silylated to form the silylated layer 28, or the silylated layer 28 may be directly formed on the organic film 22 without forming the silylation target layer 23.

Next, the organic film 22 is subjected to etching by using plasma generated from the etching gas used in the etching method for any of Embodiments 1 through 5, namely, the etching gas including, as a principal constituent, a mixed gas of a molecule including carbon and hydrogen and a molecule including nitrogen, by using the silylated layer 28 as a mask. Thus, openings 29 are formed in the organic film 22 as is shown in FIGS. 12A and 12B.

Figure 12A:
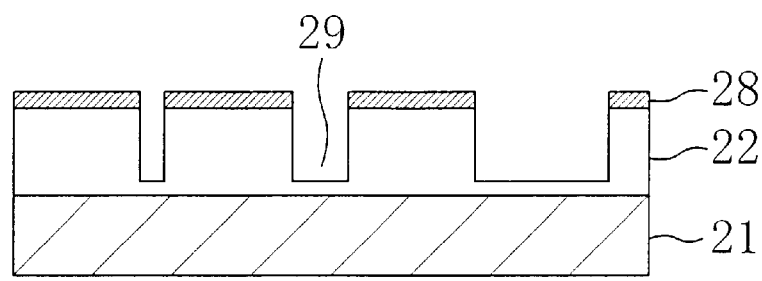
FIGS. 12A and 12B are cross-sectional views for showing other procedures in the pattern formation method for Embodiment 7.

FIG. 12A shows a state in the middle of the etching of the organic film 22, and since the etching is carried out under the conditions of any of Embodiments 1 through 5, the etching is conducted in a constant etching rate regardless of the diameters of the openings 29.

Figure 12B:
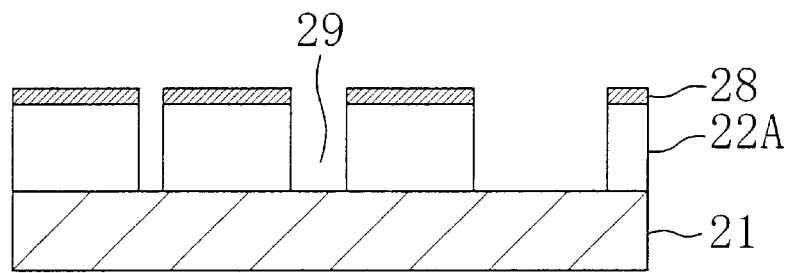
Figure 13A:
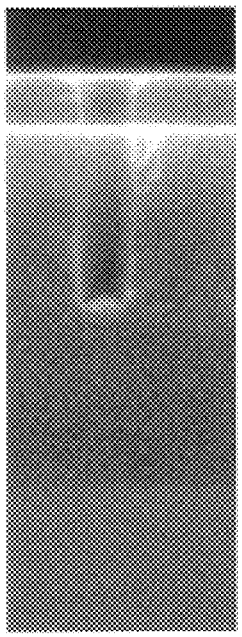
FIGS. 13A, 13B, 13C and 13D are cross-sectional SEM photographs of holes formed in an organic film by a method for etching an organic film of Conventional Example 1.
Figure 13B:
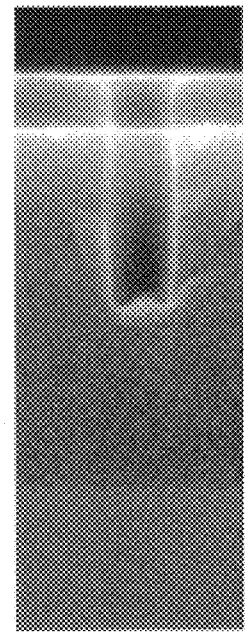
Figure 13C:
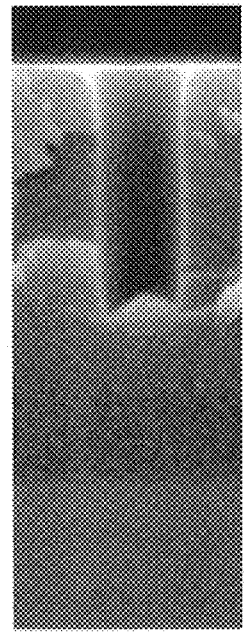
Figure 13D:
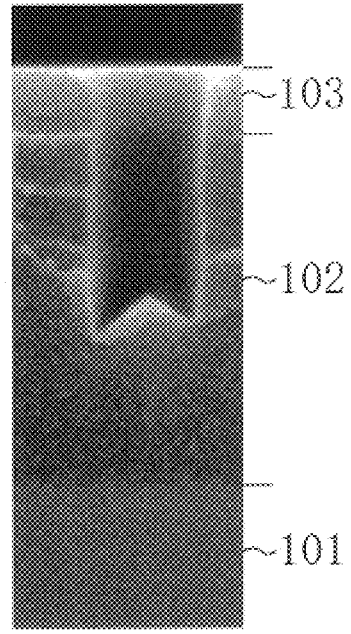
Figure 14A:
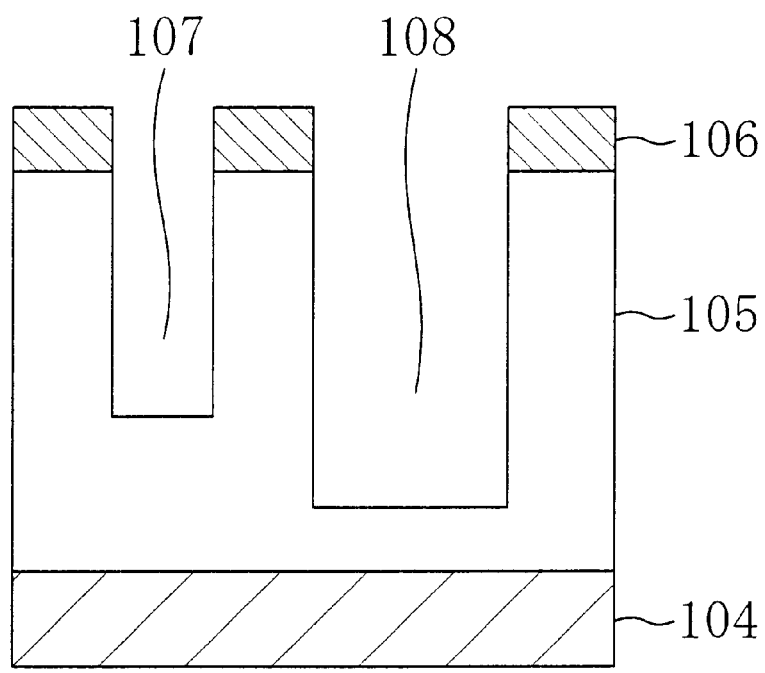
FIGS. 14A and 14B are cross-sectional views for showing procedures in a method for fabricating a semiconductor device of Conventional Example 2.
Figure 14B:
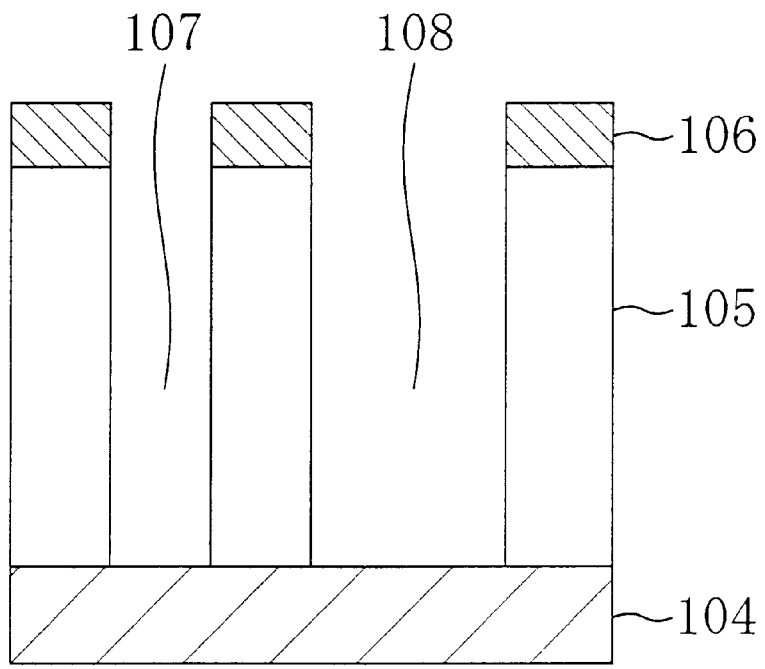
Figure 15:
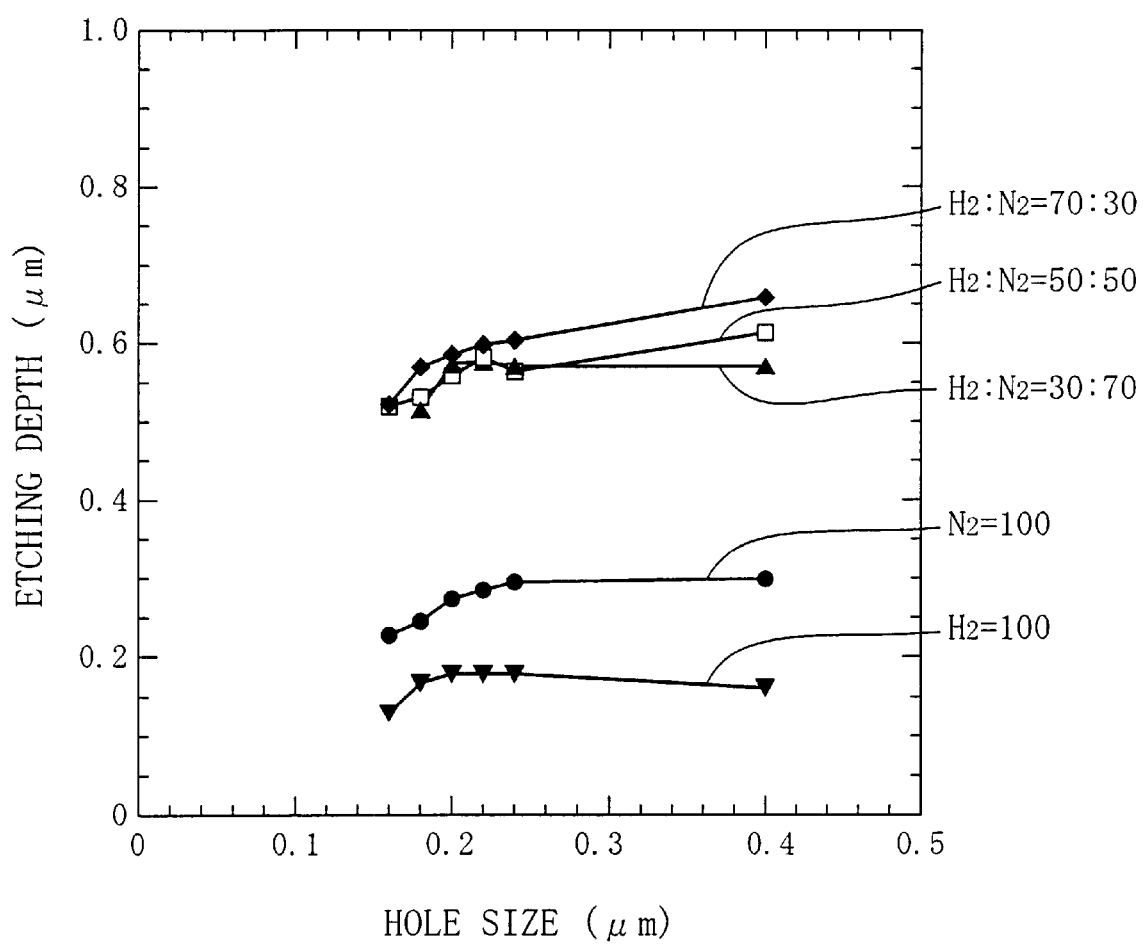
FIG. 15 is a diagram for showing the RIE lag characteristic of the method for etching an organic film of Conventional Example 1.
Figure 16A:
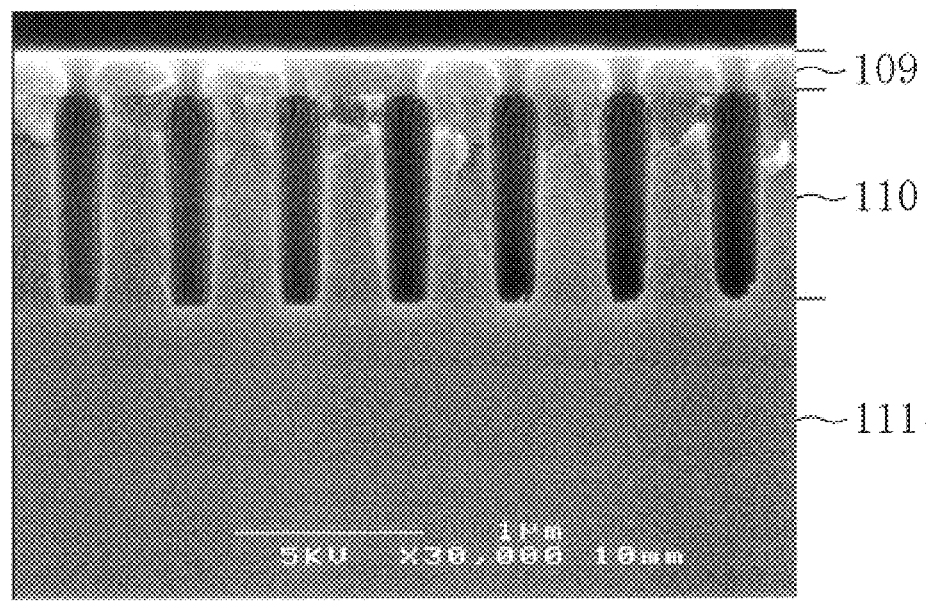
FIGS. 16A and 16B are cross-sectional SEM photographs of organic film patterns formed by a pattern formation method for Conventional Example 3.
Figure 16B:
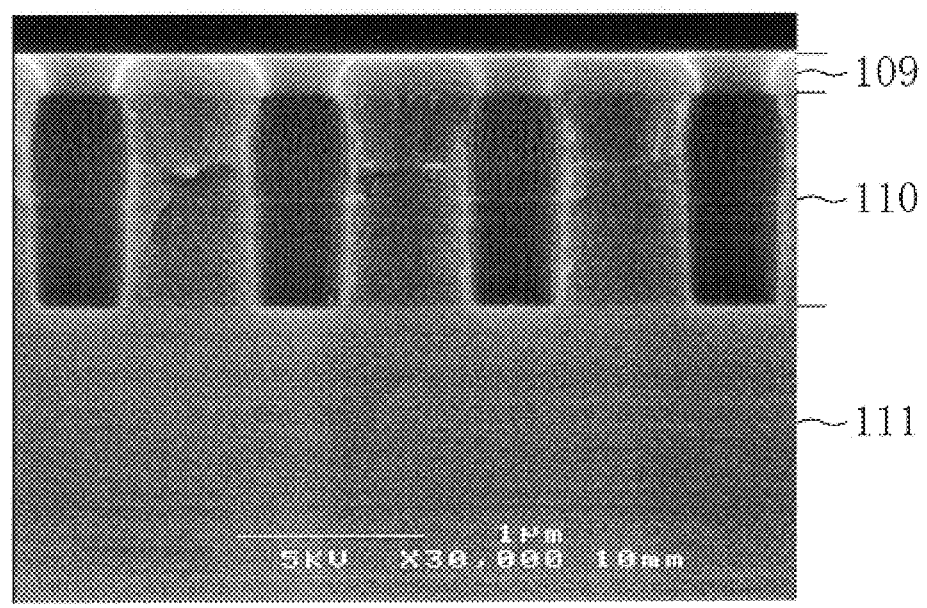

FIG. 12B shows a state where the etching of the organic film 22 is completed to form an organic film pattern 22A from the organic film 22. Since the etching is carried out under the conditions of any of Embodiments 1 through 5, the openings 29 formed in the organic film pattern 22A can be prevented from having a larger diameter than openings of the silylated layer 28 and from having a bowing cross-section.

Furthermore, since the etching is carried out under the conditions of any of Embodiments 1 through 5, the etching is proceeded at substantially the same timing to the surface of the semiconductor substrate 21 regardless of the diameters of the openings 29. Accordingly, the organic film pattern 22A can be formed through desired over-etching, namely, small over-etching, regardless of the diameters of the openings 29. In other words, large over-etching, which is required in the conventional etching method with a large RIE lag characteristic, can be avoided, so as to reduce a dimensional difference in transferring a pattern. As a result, the fine organic film pattern 22A can be formed highly precisely.

Moreover, since the organic film can be stably processed without causing excessive or insufficient etching and without depending upon the diameters of the openings 29, the process can attain a large process margin (process window).

Although the semiconductor substrate 21 is formed from a silicon substrate in Embodiment 7, a glass substrate used in a liquid crystal display panel or the like or a substrate of a compound semiconductor may be used instead.

The method described in Embodiment 7 is the top surface imaging process where the mask layer formed on the organic film is the silylated layer formed in an exposed or unexposed portion of the organic film. Instead, a three-layer resist process may be employed, so as to use, for example, a patterned silicon oxide film as the mask layer formed on the organic film.

What is claimed is:

1. A method for etching an organic film comprising a step of etching an organic film by using plasma generated from an etching gas containing a first gas including a straight chain saturated hydrocarbon and a second gas including a nitrogen component, wherein said etching gas contains no oxygen gas.

2. The method for etching an organic film of claim 1, wherein said etching gas further contains a gas including a compound including carbon, nitrogen and hydrogen.

3. The method for etching an organic film of claim 2, wherein said compound is methylamine.

4. The method for etching an organic film of claim 1, wherein said first gas is a methane gas and said second gas is a nitrogen gas.

5. The method for etching an organic film of claim 1, wherein said etching gas further contains an inert gas.

6. A method for fabricating a semiconductor device comprising the steps of:

forming an organic film on a semiconductor substrate;

forming, on said organic film, a mask pattern including an inorganic compound as a principal constituent; and forming a recess in said organic film by selectively etching said organic film by using said mask pattern and by using plasma generated from an etching gas containing a first gas including a straight chain saturated hydrocarbon and a second gas including a nitrogen component wherein said etching gas contains no oxygen gas.

7. The method for fabricating a semiconductor device of claim 6, wherein said etching gas further contains a gas including a compound including carbon, nitrogen and hydrogen.

8. The method for fabricating a semiconductor device of claim 7, wherein said compound is methylamine.

9. The method for fabricating a semiconductor device of claim 6, wherein said recess includes a via hole and an interconnect groove formed above said via hole and is filled with a metal material film by a dual damascene method.

10. The method for fabricating a semiconductor device of claim 6, wherein said first gas is a methane gas and said second gas is a nitrogen gas.

11. The method for fabricating a semiconductor device of claim 6, wherein said etching gas further contains an inert gas.

12. A pattern formation method comprising the steps of:

forming an organic film on a substrate;

forming, on said organic film, a mask layer including an inorganic component; and forming an organic film pattern from said organic film by selectively etching said organic film by using said mask layer and by using plasma generated from an etching gas containing a first gas including a straight chain saturated hydrocarbon and a second gas including a nitrogen component, wherein said etching gas contains no oxygen gas.

13. The pattern formation method for claim 12, wherein said etching gas further contains a gas including a compound including carbon, nitrogen and hydrogen.

14. The pattern formation method for claim 13, wherein said compound is methylamine.

15. The pattern formation method for claim 12, wherein said first gas is a methane gas and said second gas is a nitrogen gas.

16. The pattern formation method for claim 12, wherein said etching gas further contains an inert gas.

17. The pattern formation method for claim 12, wherein said mask layer is a silylated layer.

* * * * *